(12) United States Patent
Hall

(10) Patent No.: US 7,490,769 B2
(45) Date of Patent: Feb. 17, 2009

(54) MODULAR ARCHITECTURE SENSING AND COMPUTING PLATFORM

(76) Inventor: Donald R. Hall, 309 N. Filmore St., Arlington, VA (US) 22201

( * ) Notice: Subject to any disclaimer, the term of this patent is extended or adjusted under 35 U.S.C. 154(b) by 0 days.

(21) Appl. No.: 11/701,904

(22) Filed: Feb. 2, 2007

(65) Prior Publication Data
US 2007/0131756 A1 Jun. 14, 2007

Related U.S. Application Data

(60) Division of application No. 10/837,166, filed on Apr. 30, 2004, now Pat. No. 7,172,119, which is a division of application No. 10/165,951, filed on Jun. 10, 2002, now Pat. No. 6,766,950, which is a continuation-in-part of application No. 08/997,188, filed on Dec. 16, 1997, now Pat. No. 6,402,031.

(51) Int. Cl.
G06F 19/00 (2006.01)
(52) U.S. Cl. ...................................... 235/400
(58) Field of Classification Search ................. 235/400, 235/441, 487, 492, 486, 493, 472.01–472.03; 361/800, 788; 342/121, 122
See application file for complete search history.

(56) References Cited

U.S. PATENT DOCUMENTS

| | | |
|---|---|---|
| 4,599,620 A | 7/1986 | Evans |
| 4,758,767 A | 7/1988 | Blake |
| 5,036,307 A | 7/1991 | Reavell et al. |
| 5,289,340 A | 2/1994 | Yoshifuji |
| 5,469,335 A | 11/1995 | Kluth et al. |
| 5,509,304 A | 4/1996 | Peterman et al. |
| 5,536,177 A | 7/1996 | Casey |
| 5,544,525 A | 8/1996 | Peterman et al. |
| 5,726,660 A | 3/1998 | Purdy et al. ................. 342/357 |
| 5,786,106 A | 7/1998 | Armani ....................... 429/98 |
| 5,786,789 A | 7/1998 | Janky .......................... 342/357 |
| 5,812,928 A | 9/1998 | Watson, Jr. et al. |
| 5,880,677 A | 3/1999 | Lestician |

(Continued)

FOREIGN PATENT DOCUMENTS

WO      WO 99/42964      8/1999

(Continued)

Primary Examiner—Thien M Le
(74) Attorney, Agent, or Firm—Greenblum & Bernstein, P.L.C.

(57) ABSTRACT

A weather resistant modular sensor and computing platform reduces costs and enhances versatility of sensor systems. Rapidly evolving electronic technology results in hyper-obsolescence wherein sensor systems that are state of the art technology when designed, fall behind the art quickly as new transducers, batteries and components are developed. A cylindrical shaped modular system provides an architecture for up-grading sensors, batteries, special modules, communications, and control. A modular architecture extends the life cycle of a system and avoids hyper-obsolescence and the requirement to design a complete new system to incorporate new technology. Modularity and low cost manufacturing methods enable the practical definition of a cylindrical computer. The cylinder shaped enclosures have on their ends a common connection interface to which modules may be added. This provides a long system life cycle and wide ranging versatility. The size of the platform is not restricted. Larger systems are capable of supporting more sophisticated processing. A scaled up version of the modular platform provides an outdoor weather resistant community computing server.

23 Claims, 23 Drawing Sheets

U.S. PATENT DOCUMENTS

| | | |
|---|---|---|
| 5,894,422 A | 4/1999 | Chasek |
| 5,898,904 A | 4/1999 | Wang |
| 5,942,731 A | 8/1999 | Rogerson |
| 6,029,072 A * | 2/2000 | Barber ................. 455/557 |
| 6,227,931 B1 | 5/2001 | Shackelford |
| 6,402,032 B1 | 6/2002 | Huang et al. |
| 6,590,525 B2 * | 7/2003 | Yule et al. .............. 342/357.06 |
| 2002/0153419 A1 | 10/2002 | Hall |
| 2003/0031321 A1* | 2/2003 | Mages ................... 380/270 |
| 2003/0114206 A1* | 6/2003 | Timothy et al. ............. 455/575 |
| 2003/0134048 A1 | 7/2003 | Shiotsuka et al. |
| 2003/0222747 A1 | 12/2003 | Perkinson et al. |
| 2003/0224784 A1 | 12/2003 | Hunt et al. |
| 2004/0031219 A1 | 2/2004 | Banister |
| 2006/0049977 A1 | 3/2006 | Vacanti |
| 2006/0097855 A1 | 5/2006 | Turnbull et al. |
| 2006/0104038 A1 | 5/2006 | Jones |
| 2007/0285227 A1* | 12/2007 | Timothy et al. ........ 340/539.13 |

FOREIGN PATENT DOCUMENTS

| | | |
|---|---|---|
| WO | WO 02/058020 A2 | 7/2002 |

* cited by examiner

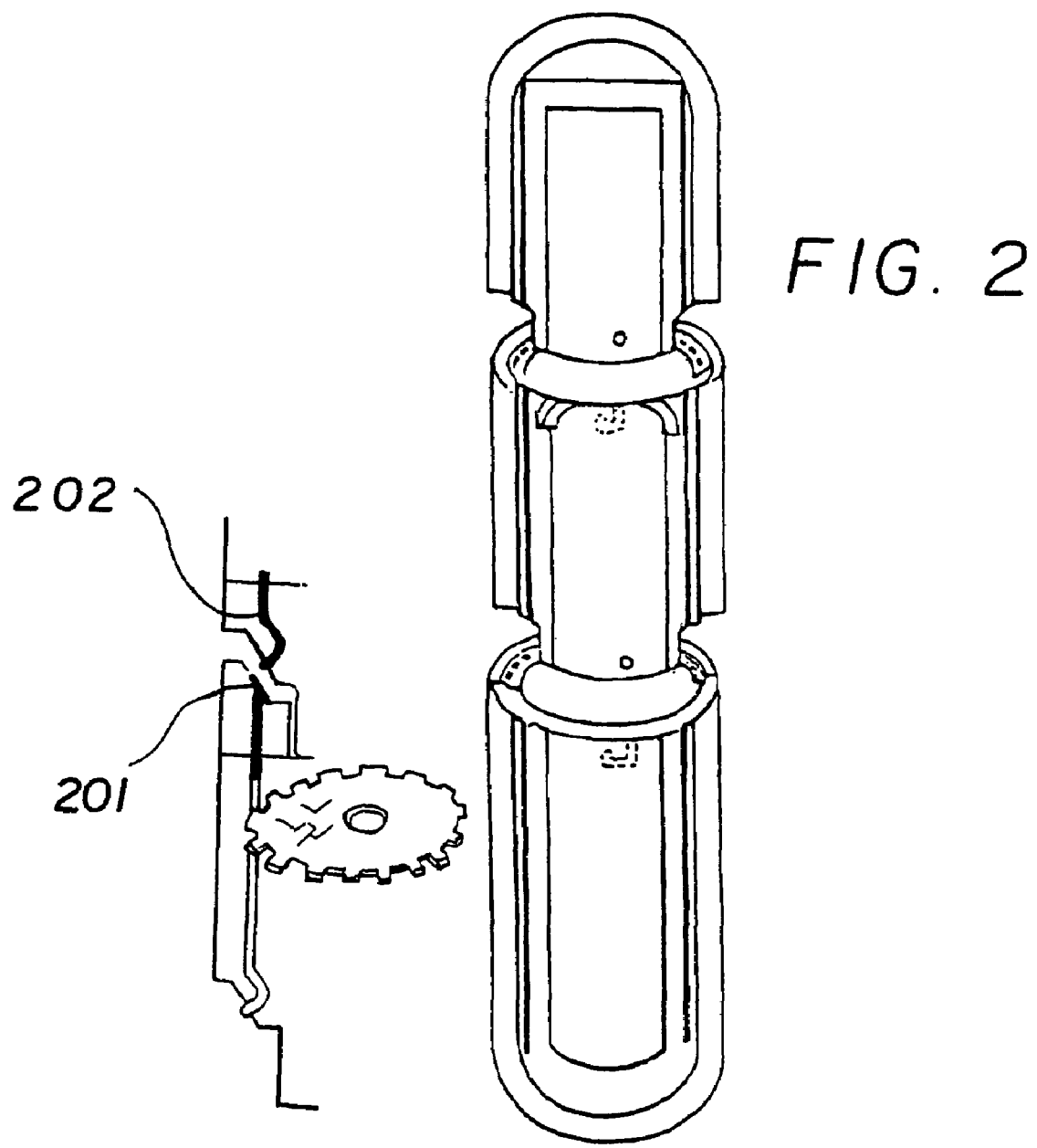

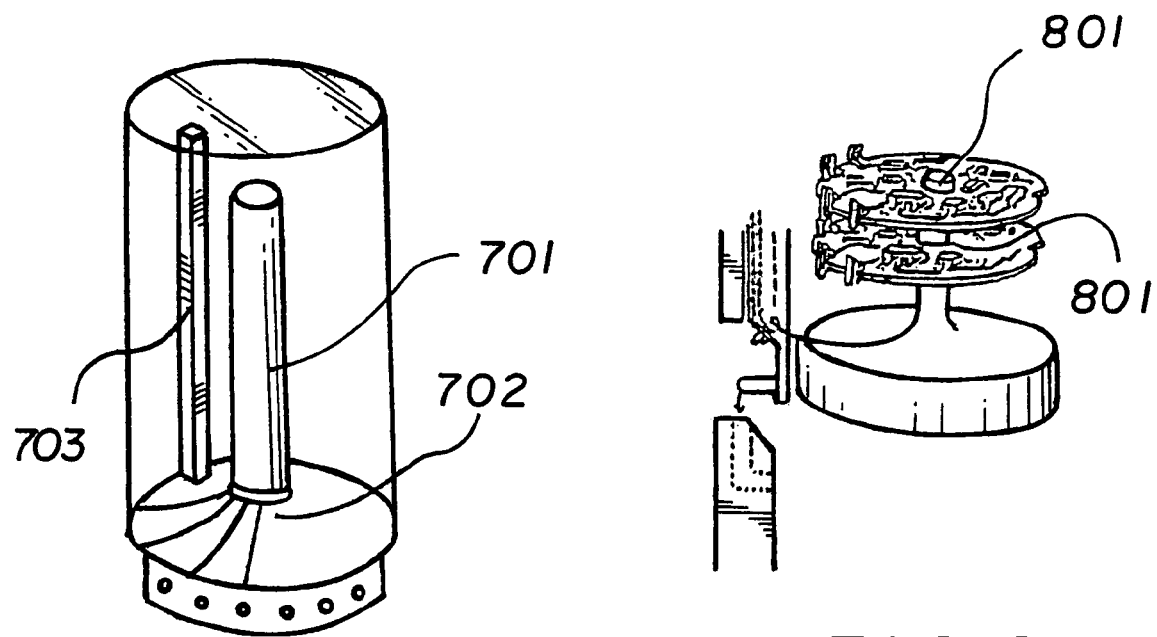
FIG. 7
FIG. 8
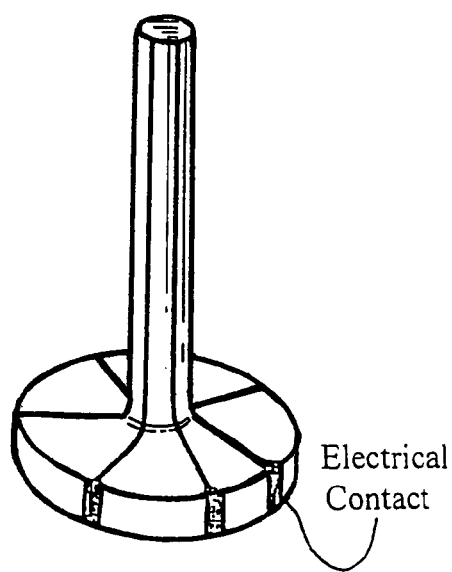
Electrical Contact
FIG. 9

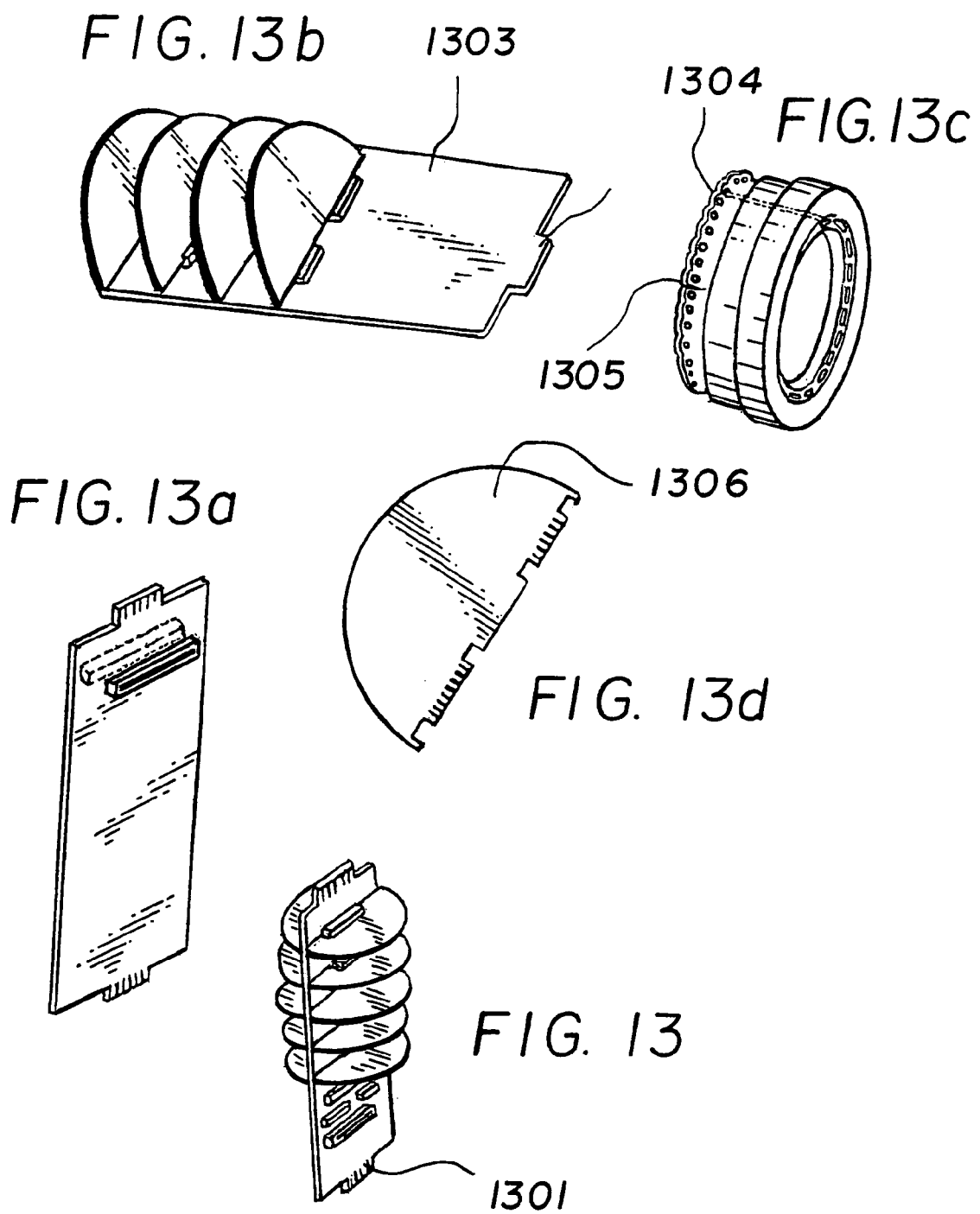

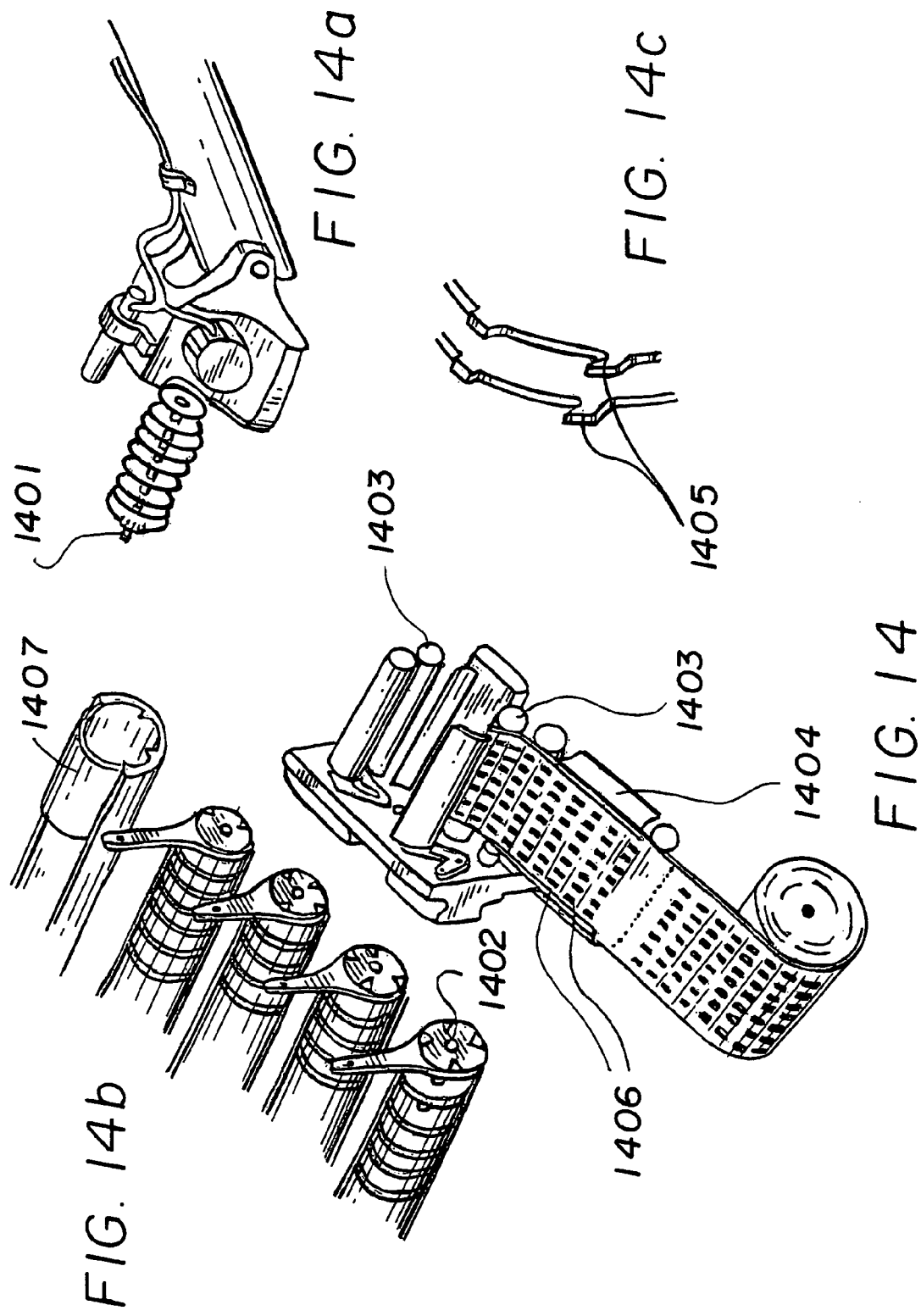

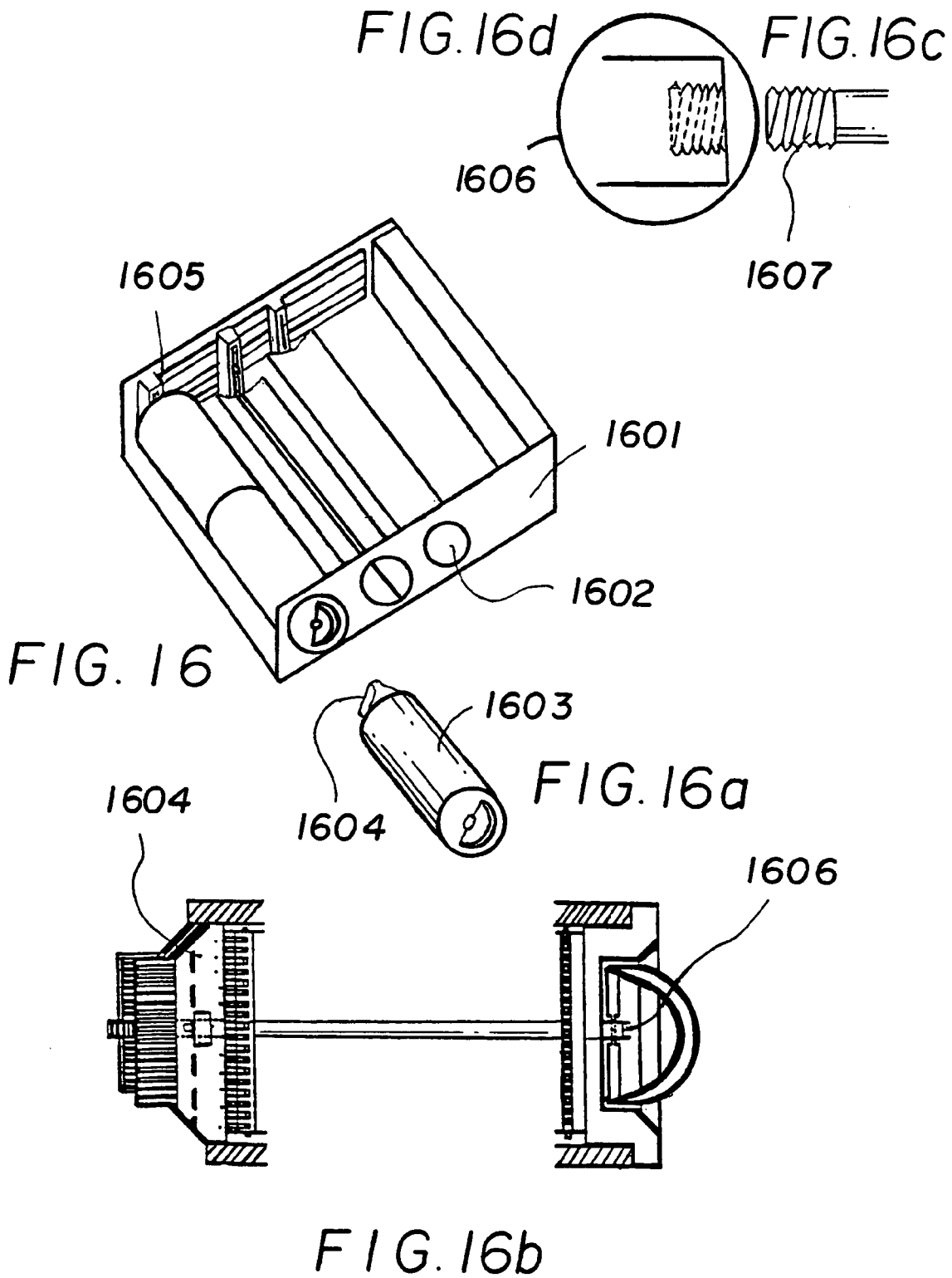

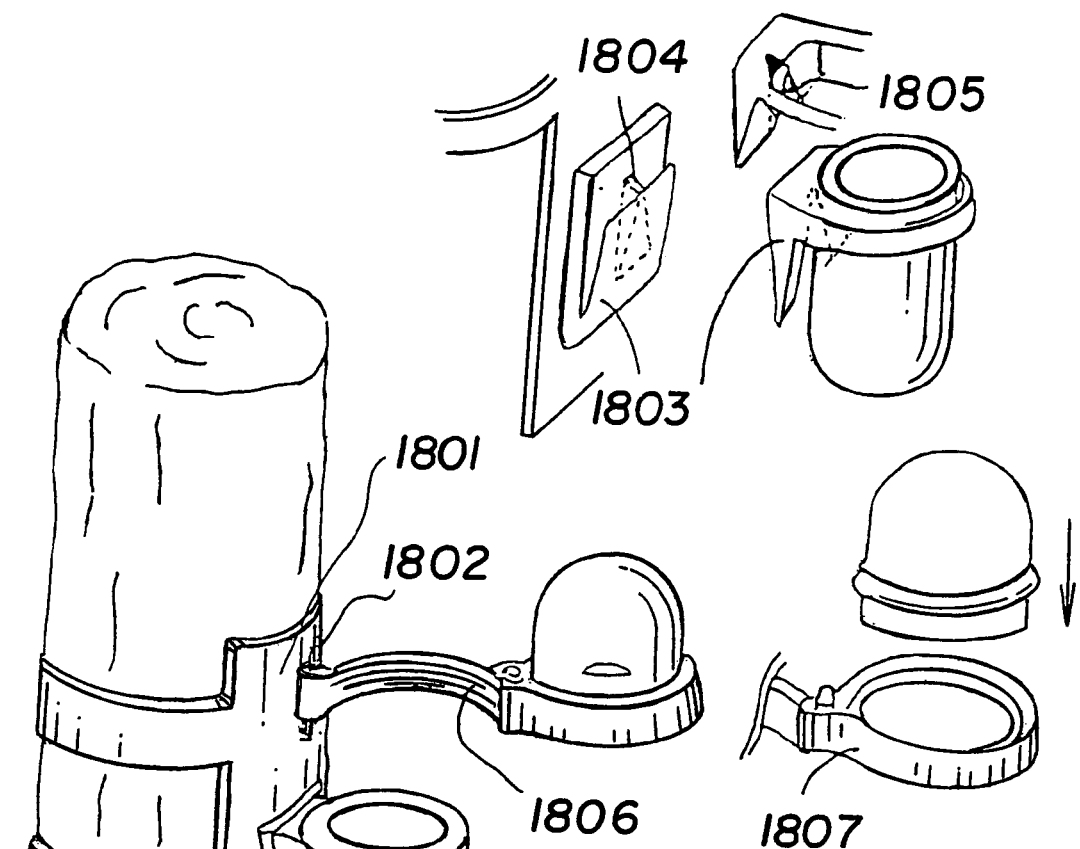
FIG. 18a
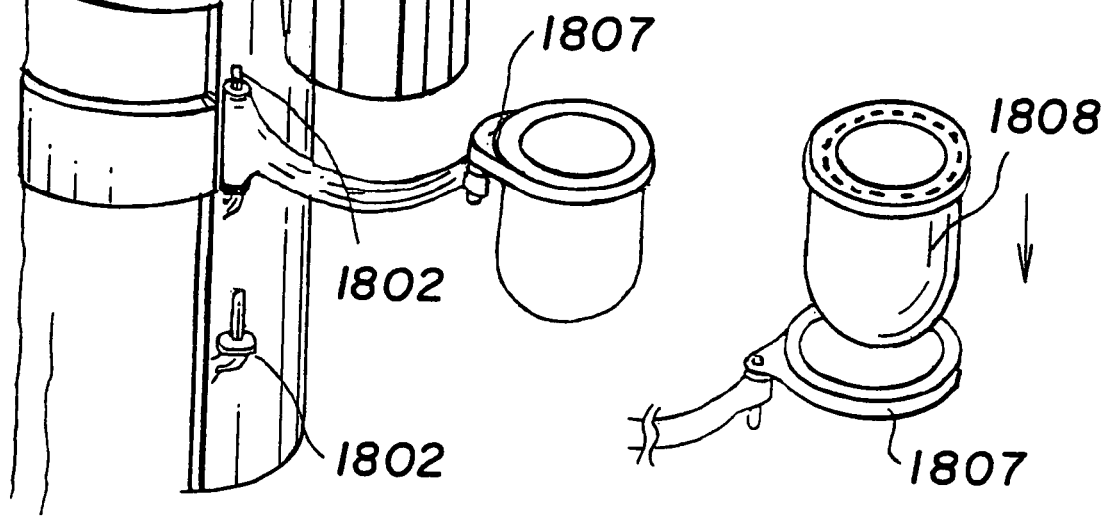
FIG. 18b
FIG. 18
FIG. 18c

MODULAR ARCHITECTURE SENSING AND COMPUTING PLATFORM

RELATED APPLICATIONS

This application is a divisional application of application Ser. No. 10/837,166, filed Apr. 30, 2004 now U.S. Pat. No. 7,172,119, which is a divisional application of application Ser. No. 10/165,951, filed Jun. 10, 2002, now U.S. Pat. No. 6,766,950, which is a Continuation-In-Part of application Ser. No. 08/997,188, filed Dec. 16, 1997, now U.S. Pat. No. 6,402,031, for MODULAR ARCHITECTURE SENSING AND COMPUTING PLATFORM. The entire disclosures of prior application Ser. No. 10/837,166 filed Apr. 30, 2004, Ser. No. 08/977,188, filed Dec. 16, 1997, and Ser. No. 10/165,951, filed Jun. 10, 2002, are considered to be part of the disclosure of this application and are hereby incorporated by reference herein in their entireties.

FIELD OF THE INVENTION

An outdoor computing platform is defined that will maximize modularity to provide ease of configuration, maintenance, and technical upgrading. The computing platform may be deployed into harsh environments and it may be equipped with a variety of mission oriented modules. The platform will provide for simple module interchange and maintenance without exposing internal electronics to environmental elements.

BACKGROUND OF THE INVENTION

The term Hyper-obsolescence is introduced, and defined as a problem created by rapid advances in electronics components and systems. Newer improved technology is only a short time behind the state of the art today. Many personal computer owners are aware of the phenomenon. Today's technology is employed to produce another generation of improved technology. The Internet puts very fast linkages into the hands of engineers to define parts, locate services, and create prototypes. The new technology is then rapidly introduced to the market. Investors are aware of these factors within technology. In order to dispel the negative impact of Hyper-obsolescence in electronics systems a technological architecture is required that can accommodate updates within a modular system which incorporates a standard connectivity feature.

Early obsolescence is an obstacle to completing far reaching sensor systems supported by sophisticated computerized data fusion systems. A sensor architecture is needed that is sufficiently flexible to incorporate new technology as it evolves. Only in this way can we get enough time to build supporting computer software and communications systems to work with the sensors. The support systems need to remain operational over a longer span of time. This will allow time to develop an infrastructure and give the support personnel time to become proficient with all aspects of an engineering infrastructure.

The creation and development of large scale sensor systems that are supported by sophisticated computerized data fusion and presentation capability requires substantial time and financial investment. Anticipated benefits from data collection systems within which sensors and actuators are used are often never met due to short life cycles. The components inside sensors become obsolete very quickly. Batteries also become obsolete very quickly.

Software development undertaken to create sophisticated fusion systems to process data collected by the sensors must be accomplished very quickly to achieve targeted benefits. The short life cycle for sensor systems has been responsible for the failure to develop comprehensive systems. We do not have a system that is designed to adapt and accommodate changes and thereby remain technologically current.

To avoid hyper-obsolescence a modular architecture is needed that can integrate new technology as it becomes available. We could produce a survivable design by building elements of a sensor platform as interchangeable modules which are connected to a bus electrically. This platform is comprised of separate modules which can be connected to one another. Each module includes an internal communications bus which penetrates the module enclosure at the end of the cylindrical module. When the modules are interconnected the internal circuit boards of the modules are electrically connected via this same bus. The modules can be configured to include a variety of common bus standards. A serial bus is used for control functions while standard parallel buses are used for high speed computing. The modules use a standard mechanical interface for physical interconnection.

The modular architecture sensor and computing platform proposed herein provides a computing platform that can integrate new technology incrementally.

New technology will integrate well enough and long enough to allow time to develop a sophisticated communications, and data fusion system to collect data, organize it, and transport it to sponsors.

By providing an extended life cycle for a sensor system, better cost/benefit justifications can be made for developing specialized modules with which to improve system capabilities and thus provide a versatile and comprehensive collection capability.

Serious efforts are required to provide early detection of weapons of mass destruction which are being created by nations that have strong terrorist factions. With a common sensor support platform we can produce a solid deployment capability upon which many sensors can be supported. The cylinder like shape of this system produces a form that provide advantages in many ways. The aerodynamic shape is conducive to deployment as a projectile. There are many methods of launch and propulsion but the capability that is important is provided by the sensor head and computing power within the projectile. When in flight over factories a sample of the air can be made to detect the by-products created by production of illicit materials. When suspicions are high that troops may face chemical or biological weapons these sensors can be launched to pass over regions into which the troops are moving. The sensor can gather gases and particulate matter to analyze the environment and signal by radio frequency the results back to the sponsors of the test launch. The expendable nature of the devices is made feasible by the reduction in production costs that is gained by the manufacturing method that is disclosed later in this document.

There is a large benefit in having a standard interface at the connection points of the modules. Rather than diverse groups with separate incompatible designs for sensors systems a single standard which can accommodate any sensor type can be derived from this modular design. This concept has enthusiastic support by DoD groups that recognize the lack of a common technology that can stave off obsolescence and sustain a capability to develop responses to threats of nuclear, chemical, and biological attacks. This project has been under development for over five years and research into low power systems and methods have proven that long term deployment of the platform is feasible.

The platform can provide the communications and control capability for a variety of sensors sponsored by several agencies countering known threats. Using this method an agency need only invest and perfect the sensor head to detect the threat they are pursuing. Some biological sensors will require large investments and time to develop. These groups need not focus on a transport each time they want to test or deploy a new detector. The transport will be off the shelf. The transport will be regularly improved by replacing the modular internal circuit boards as needed. The end fittings will be held to the standard design. This platform will support all of the community and allow them to focus their energy and money on better techniques to sense the agents of the threat of biological, nuclear, and chemical terrorism.

FIG. 1 shows a modular sensor computing platform. Three modules are represented. When the modules are connected together an operational sensor/computing platform is created. The technology is scaleable to provide very small systems for sensor support to larger systems for community support. The versatility results from the goal of incorporating change readily.

By providing an architecture that supports modularity on a sensor support platform we can extend a sensor system's life cycle, and subsequently improve the return on investment. The herein presented design will sustain an evolutionary program that can accrue long term value from initial and subsequent investments, and thereby justify an investment to develop a comprehensive data fusion capability. There are many benefits that could be derived from monitoring weather, temperature, biological hazards, chemical hazards, etc. The problem today is hyper-obsolescence preventing economy of scale production and inability to remain at the state of the art in transducers and batteries.

Objects and Advantages

Accordingly several objects and advantages of my invention are:

(a) to provide a weather resistant modular architecture sensor and computing electronic assembly that is configured by attaching standard modules end on end to make an operational platform;

(b) to provide a cylinder shaped modular electronic computing platform;

c) to provide a modular unit architecture that has male and/or female end fittings that are used to connect module units to similar modules;

(d) to provide a module for use within a modular architecture that has electrical contacts presented at end fittings with which to electrically and mechanically inter-connect modules when more than one module is joined together at the end fittings;

(e) to provide a cylindrical module that contains a bus on the interior cylinder wall, or in channels in the interior cylinder wall;

(f) to provide a parabolically shaped air-brake that reduces the rate of descent of a modular platform when it is falling through the atmosphere and upon touch-down the air-brake structure is repositioned by the platform and utilized as an energy concentrator or antenna;

(g) to provide a modular platform wherein joined end fittings make water resistant seals for protecting internal electronic assemblies from external weather conditions;

(h) to provide circular circuit boards that are fitted with electronic contacts that slide into in-wall bus channels wherein the channels contain electrical and/or fiber optic tracks on the internal wall of the module;

(i) to provide circular circuit boards that have an opening at the center to provide an area that can be used as expansion space to accommodate various module hardware related to an application. This center opening is also used during automated manufacturing and circuit board alignment;

(j) to provide a weather resistant modular architecture that will enclose electronic sensing, communications, data processing, mass storage and internal climate control subsystems and thereby provide an outdoor computer for serving residence and business community users with services in a local area as well as connect them with wide area network services;

(k) to provide an architecture for constructing a sensor support platform that can accommodate improvements in batteries and sensor transducers by interchanging older technology modules with modules that include new technology and thereby prevent the need to routinely redesign and replace the system;

(l) to provide a module interconnection method that will produce a configuration capability which is a way of interchanging sensor heads and power modules to configure the modular platform for a specific data collection mission that can be fitted with the latest, most technologically correct sensor or actuator;

(m) to provide a bus structure that is present on the internal walls of a cylindrical enclosure that will integrate circuit boards, and thereby provide a modular architecture within a platform module which will accommodate exchange of circuit boards to create a modular capability within the circuit board enclosure.

(n) to provide a hybrid bus track in a bus structure of a modular electronics platform upon which electrical and light signals may both be passed to other module circuitry connected to the bus track, wherein the light passing portion of the bus track is coated with light reflective coating;

(o) to provide an electrical/fiber optic connector that mates with an electrical/fiber hybrid bus track which communicates information between the circuit board and the hybrid bus;

(p) to provide a cylindrical electronic module endpoint that will mechanically mate with an associated module and also electrically connect flat contact pads with spring loaded pin contact points on an associated module endpoint interface to provide a bus architecture between the modules;

(q) to provide a programmable, modular, portable platform that can be fitted with a variety of modules to customize the device to mission requirements;

r) to provide a cylindrical, aerodynamically shaped electronics enclosure that can be dropped from an aircraft;

(s) to provide a circular circuit board that is provided with electrical contacts on the perimeter of the board and a hole at the center of the board which also has an index notch;

(t) to provide an end fitting dummy terminator to cover a modular end-fitting and seal it from dirt and moisture;

(u) to provide a modular computing platform which supports sensors and communications within a cylindrical enclosure assembled from modules joined together at endpoints where joined endpoints are sealed with an O ring and a metallic mesh gasket to seal out the elements and to seal the joint from the passage of electromagnetic energy generated internally, or may occur externally as the result of an electromagnetic pulse;

(v) to provide a power supply module for a modular sensor and computing platform that comprises a bus structure that will add power supply modules to a parallel power bus or a series power bus such that unanticipated power requirements can be accommodated and thereby supply special electronics with adequate voltages for applications;

(w) to provide a power supply module for a modular sensor platform that comprises a radioactive isotope to generate electrical power and to provide in addition, a fuel cell module, and a rechargeable battery module (x) to provide a modular sensor and computing platform that comprises a unique binary coded address to which it will respond when addressed electronically;

(y) to provide a modular computer architecture wherein each module comprises a micro-controller with a unique address which communicates with other modules attached to a dynamically constructed bus which is modified by addition or subtraction of modules which contain bus elements which are compatible with other modules.

(z) to provide an innovative command selection device which when used within a human interface module or terminal module the obstacle of very small controls and large fingers can be easily overcome even while wearing gloves.

SUMMARY OF THE INVENTION

When deploying a modular platform, communications versatility can be provided by interchanging modules as appropriate. If an anticipated data gathering mission required a platform to provide compatible communications with older deployed systems it is possible for an appropriate module to be installed to provide compatible communications.

Upon building a system that provides an anticipated long program life many modules will be developed over time and will be added to an inventory of modules. Consequently it becomes easier to integrate the platform to co-operate with many existing deployed communications systems.

When a user of this architecture needs to collect specialized data from a field environment it is not necessary that a unique system be built to support his/her individual requirement.

A data collector can focus on funding the development of a better sensor module that closely meets his/her needs. He need not finance his own separate support system. He will therefore be free from developing a platform for communications and/or control and consequently allow him/her to make an investment to underwrite perfecting a sensor/transducer to detect the targeted data of his interest. This economy will result in better higher precision detectors resulting from more effective investment.

The modular architecture will provide a generic transport that will easily evolve and be useful to a large community over an extended life cycle. In this way a sustained investment that incorporates special modules, funded by special interests, can be maximized. We can develop cutting edge sophisticated mission specific capabilities that will ultimately be available to an entire user community. Recent terrorist activities are pointing out the need to monitor public areas for harmful chemicals and toxins. Improved sensor platforms are required to underwrite sensor research and development in universities and industry.

When using the modular platform a rapid response capability is derived. It is often difficult to predict the nature of data that will be required or become important in the future. When an unanticipated Ad Hoc requirement for data occurs, it is often true that little time is available to conceive, prototype, develop and test new systems to meet the requirement. Given the availability of a modular sensor and computing platform, the time needed to respond to newly defined mission requirements would be shortened significantly. Using this new technology at most only a transducer or detection module would need to be developed. The new sensor would be added to operate within the collateral sensor support program.

During the Gulf Crises an immediate need was realized to detect chemicals and biological agents. A need was also realized to monitor SCUD missile platform movement. Each of these needs could have been met quickly with the proposed modular platform. As it was we had no appropriate response capability which resulted in exposed personnel.

The Modular Platform is a rugged survivable platform. Field environments encountered by sensor systems are harsh. Electronic systems are vulnerable when exposed to environmental elements. Reducing exposure of sensitive electronics greatly extends the anticipated operational life of a system. Vibration, shock and mishandling can damage the integrity of joints, seams and welds. The joints of the platform are sealed with an o-ring and a metal mesh seal. This electronically sealed transport will withstand the Electorate Magnetic Pulse emitted by a nuclear explosion that destroys electronic devices. Metal sensor enclosures would not be penetrated by the EMP and would therefore remain operational after a nuclear event to provide important information about contaminations and other environmental data important to recovery operations.

The cylindrical architecture of this modular platform joins the modules in a way that will minimize seam lengths and eliminate corners. Traditional boxes are vulnerable to weather elements at seams where sides are joined together. The modules of this platform are hermetically sealed. Connections between modules are made using methods proven in underwater operations. O-rings and light grease lubricant provide water tight integrity and produce an underwater modular platform. Underwater detection systems may be easily produced to survive the pressure of deep water using the suggested architecture.

Another advantage is that damage from shipping and handling of a sensor platform is minimized, by placing the cylinders into bores within foam or other protective material. This simplifies logistic operations and enhances reliability.

Air deployment pods for the platforms will release these platforms directly from the blocks of protective material that have bored out cylindrical openings within which the cylindrical platform is shipped and deployed. The dropping can be manually accomplished or accomplished via programmed control. The ease of deployment of the cylinder shape is an important aspect of the design.

The internal boards and circuitry within the enclosure can easily be placed on an internal shock absorbing circular shaped base board. The opening in the center of the circuit boards is penetrated by an alignment post that the circuit boards may move to enhance the shock absorption as the boards compress the absorber in the bottom of the assembly. This will absorb the shock from impact with the earth or during any other shock related deployment method.

An option to deliver sensor collection systems from the air offers obvious advantages. The cylindrical shape of the modular platform is compatible with operations where the platform is being distributed from an aircraft. The platform assembly can be combined in the body of a sophisticated guidance structure if required. Air deployment requires consideration of damage to the platform upon ground impact.

Attaching a parachute to the platform will slow the descent of the platform to accomplish a soft landing but this does not provide the degree of precision that is desired. A parachute would also probably interfere with platform operation upon touch down, if it came to rest over the platform.

Descent braking is accomplished by a parabolic shaped airfoil over the platform. The parabolic may be in the form of a dish or a section of a parabolic dish. The parabolic shape is employed to derive a dual use functionality of air-brake during descent and an antenna or energy concentrator on the ground. This form of air-brake will not interfere with the data collection mission of the platform after it touches down. It will become an asset to platform operation.

A light material, pressed foam, is used to provide a rigid structure to function as an air-brake and airfoil as the attached platform falls through the atmosphere with the concave surface upward. Upon touch down the parabolic airfoil is positioned to a mission oriented attitude by platform actuators. It may be positioned to act as a collector, antenna or concentrator for the programmed data collection mission. A light metal film over the back surface of the foam structure provides the electromagnetic reflection surface when used as a parabolic antenna.

A more desirable descent control system would control the approach as well as descent to a landing site. If a smaller parabolic air-brake/airfoil structure is attached to the larger by a narrow brace the small parabolic provides a functionality that is similar to the tail section of an airplane and adds stability to produce a stable controllable package. This design was tested and found to be stable.

This parabolic structure uses a large parabolic in the front area and a small parabolic in the rear area. The functional placement of the large parabolic is as the main wing of an aircraft and the small parabolic is as the small wing of an aircraft. A small interconnecting shaft between the two is similar to the body section of an aircraft structure is controlled by platform actuators. To complete the descent control structure another airfoil is added to act as a rudder and vertical stabilizer. Control is provided by actuators and electronics within the upper module. The same actuators and control electronics are used, after touchdown, to position the parabolic and transform the functionality of the parabolic structure to an antenna or energy concentrator.

During descent the information needed to find the targeted drop site is collected and developed by an on-board module. To develop error correction data during descent a target sensing module at the bottom of a modular platform is active. This module is made of a transparent material which will allow light to pass through the module's enclosure wall into the module. Inside the module an optical sensor detects light that indicates the landing target. The light that the optical sensor seeks is a light upon which to guide. The target sensing module will send data over the bus to the command and control module which will develop instructions that will then be directed to the descent controller.

The descent control module employs actuators directed by instructions provided by the command and control module which operates in combination with the optical sensor to adjust the attitude of the platform during descent to seek an intentionally illuminated touch down target site. The source of light being used to illuminate the touch down site may be provided in a variety of ways. In some cases the falling platform may emit a signal that when received by an associated platform on the ground turns on the landing marker light. This light source could be provided by another previously placed modular platform that was fitted with an illumination module that radiated light at a coded pulse repetition rate that the descending module would recognize and seek out.

The platforms Global Position Sensor can be used to establish very accurately where the platform lands. This information is provided to the computer for use during reporting.

Field service on the platform is simplified. Maintenance can be accomplished with little specialized training. During field operations if it is found that a modular platform is needed to provide a function other than what it is configured for, it is an easy matter to remove a module and replace it with another. Maintenance may be accomplished by inter-changing modules to detect failures in the field by substituting known good modules with suspected platform modules.

Software within the command and control module will recognize a sensor module type from the structure of its unique digital address and thereafter execute proper subroutines to integrate the module into the operational platform. The address will specify: a System, subsystem and module ID.

BRIEF DESCRIPTION OF THE DRAWINGS

FIG. 2 depicts another embodiment of the modular platform wherein the end-fittings have been changed and a flexible mother-board is used.

FIG. 2A depicts a partial view showing the electrical contacts between two primary modules.

FIG. 5A depicts a partial view of a modular platform showing a sliding electrical contact.

FIG. 5B depicts a partial view of a modular platform showing wall channels into which fit the in-wall circuit tracks.

FIG. 7 represents an enclosure that illustrates electrical tracks connected to a center post within the enclosure and the tracks passing through the enclosure material to contacts on the end-fitting of the enclosure. A index bar is also shown.

FIG. 8 depicts circular circuit boards mounted on a support post. The post has bus tracks on its surface and the bus tracks cross a base outward to make contact with an in-wall bus. A mechanical connector is also shown, as well as a channel to accommodate it.

FIG. 9 illustrates electrical tracks along a vertical post to create a bus.

FIG. 13 depicts an embodiment of the modular platform which incorporates a vertically mounted, two sided mother board which will accept semicircular circuit boards.

FIG. 13A depicts a partial view of a modular platform showing a vertically mounted, two-sided motherboard according to the present invention.

FIG. 13B depicts a partial view of a modular platform showing a vertically mounted, two-sided motherboard according to the present invention and comprising a series of semi-circular circuit boards mounted on one side of the motherboard.

FIG. 13C depicts an end-fitting and its' associated transition board according to the present invention.

FIG. 13D depicts a semi-circular circuit board according to the present invention.

FIG. 14 shows a method of manufacture which derives large advantages from adopting a circular circuit board.

FIG. 14A depicts a partial view of the method according to the present invention wherein an assembly post carries the board assembly throughout the method.

FIG. 14B depicts circular circuit boards wrapped in flexible circuit boards at various stages of completion.

FIG. 14C depicts a partial view of a circular circuit board according to the preset invention and having teeth to engage a flexible circuit board.

FIG. 16 depicts an assembly of a circuit carrier with two end-fittings and a center post without the circuit boards in place.

FIG. 16A depicts an end fitting for the circuit carrier shown in FIG. 16 that is used to mate with a fitting inside of a Personal Computer.

FIG. 16B depicts a close view of two circuit carriers joined inside of the PC and held together with a threaded nut on the D RING end and a threaded bolt on the circuit connection end.

FIGS. 16C and 16D, respectively, depict a bolt and a nut for connecting the end of a circuit carrier according to the present invention into a PC.

FIGS. 18, 18A, 18B and 18C show a mounting system that can be used to mount the modular platform to a utility pole and provide the capability to replace a single module quickly and easily.

DETAILED DESCRIPTION OF THE INVENTION

An effective modular architecture can be developed based on cylindrical modules fitting together end to end.

Modules of this architecture are connected at end fittings. By employing a standard architectural interface new modules can easily be incorporated into a sensor program to add new scope to capabilities as required.

The platform is shaped like a cylinder and platform modules are joined end to end. Electrical connections are presented at a module's end fitting to connect signals carried on an internal standardized electrical bus that is interconnected between the modules at the end-fittings.

Two basic types of module are used; a terminating module and an interior module. A terminating module fits on the end of a cylindrical stack assembly and is equipped with one standard end fitting. Sensor modules are equipped with internal components related to interacting with the environment. An antenna, a sensor head, actuator head, laser, or emitter would typically be installed on end of a platform.

Another module type is referred to as an Interior Module because it adjoins other modules on both of its end fittings within a stack of modules which make up a platform. An interior module is equipped with two interface end points which enable it to be joined on both ends.

It is also possible to terminate an Inside Module with a Dummy End Fitting which will seal a unit's electrical contacts and mechanical connections from exposure when not in use and prevent damage during shipment, etc. The dummy terminator could also be used to close an Inside Module's end point if placed in a stack without a terminating module on its end point.

Figure 1:
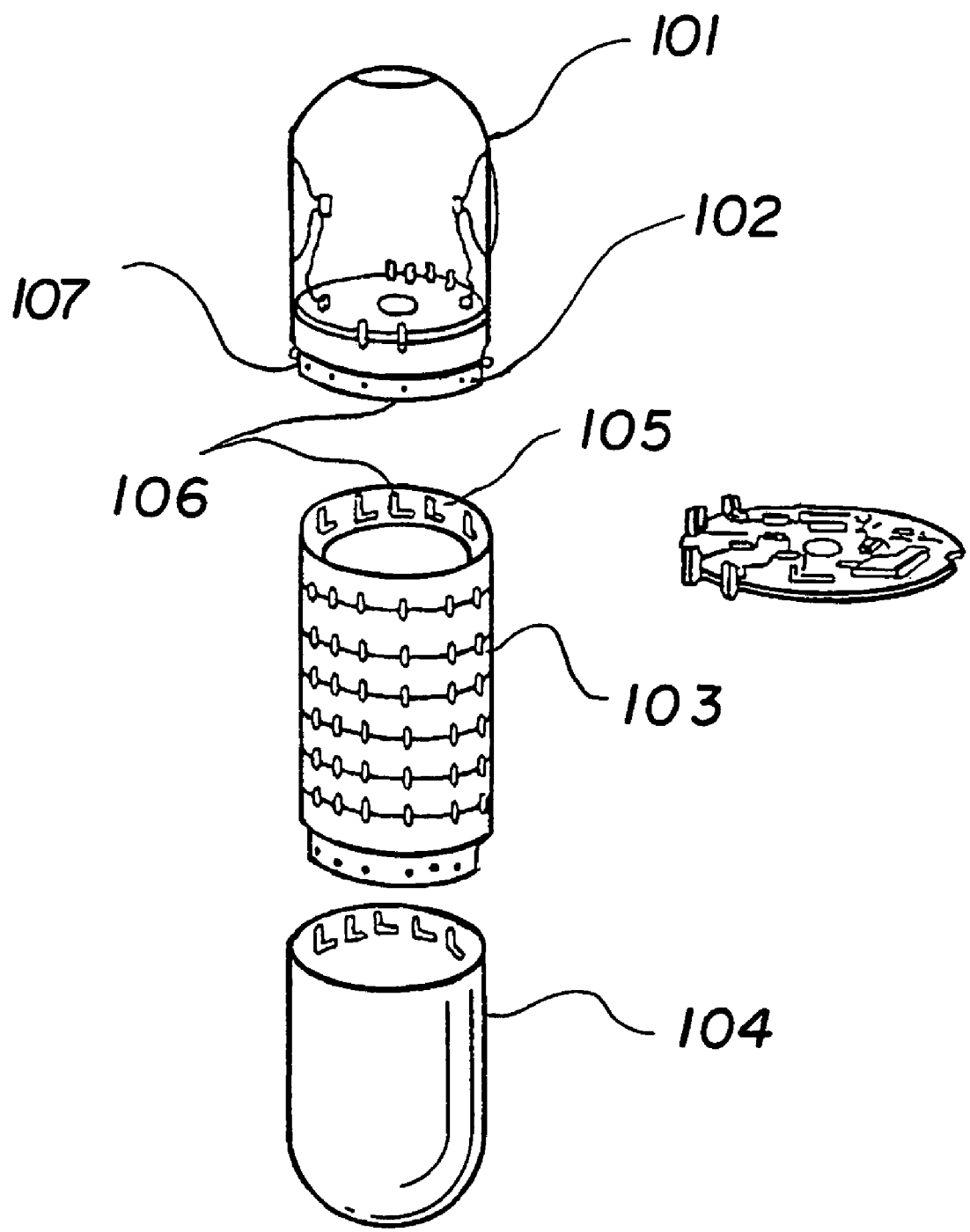
FIG. 1 depicts a sensor platform with the three primary modules; sensor, controller and power supply.

FIG. 1 illustrates three modules arranged to complete a simple modular platform. A sensor head or actuator head 101 is joined at an end fitting 102 to a control module 103. The control module is joined at the other end fitting to a battery module 104. Electrical connections are made at the end fittings to integrate the modules into an operational platform.

A fundamental module of an assembly, which is common to all modules is the Command and Control Module, or Control Module. This module is equipped with a micro-controller or microprocessor to provide programmed control of the platform. A micro-controller with on-chip memory will perform a large number of control and collection tasks. It is the common programs and bus structure hosted by the command and control module that provides the fundamental control point for standard inter-operation of modules to be integrated on the platform.

During operation it will be necessary to transmit collected information to another platform that performs as a parent which can make a transmission to a more remote site. Internal to the module, data which is to be transported or communicated will be passed over the platform bus to an addressed device within the module on the platform or to a chip within the command and control module. A serial two-wire or three-wire bus is used on some platforms but on larger platforms the bus would be compliant with any of the commonly known parallel computer bus standards available.

The Inter Integrated Circuit Communications, 12C, bus creates a capability of the controller to address integrated circuits specifically on other circuit boards in modules. This provides a bus which not only connects modules but it also provides a bus that transits across the internal boards of a module to reach individual chips. The integrated circuit control bus transverses a board and the boards are interconnected by the platform bus appearing at the end-fittings. This creates a very versatile control capability. Multiple computers are integrated into this system. Multiple computers and controllers can be distributed to operate sub-systems on the platform. A Master Computer controls the associated slave processors.

After deployment each modular platform can be administered by its sponsor. The sponsor can stay in contact (send and receive) with his sensor at its remote location easily by passing information via the Internet, or private DoD TCP/IP networks or Internet servers. The sensor system reaches the first hop connectivity point through Satellite, radio, or land line.

When a platform receives a command, the platform can execute a command, modify its internally programmed mission, adjust a threshold used as a margin for event reporting, or accept new programming. Command execution may be carried out by an actuator head on the platform or within the sensor module or within the control program. An actuator may also be controlled by the command and control module itself as the result of thresholds being reached that are decision related during the data collection.

The modules are connected electrically to provide a bus architecture over which electrical signals and power may pass as required. More than one power bus is included in the bus structure. One such bus supplies power to operate the logic circuitry; typically 3 to 5 volts for logic; today.

Additional power modules may be added to a platform to provide a longer life supply for extended missions. Another power bus is a serial power bus. A Series type bus voltage can be raised by adding additional battery cell series modules. The series bus embodies a reversed pin connection within its module to create the series bus versatility which is used to adjust the basic supply voltage when needed.

Software that is developed to operate on a platform is installed or down-loaded into a module via a modular platform software development and programming station.

A software development station 3 is used when designing and developing software that is to be used by the control modules. The development station embodies a standard platform end fitting 301 to which one may attach platform modules to be down-loaded, tested, or put into development. This development system can easily be put into operational use to directly support a small sensor field.

Each programmable module comprises a software download recognition means. This will enable a module's controller to recognize a Download Command Sequence occurring on the standard bus to which it is attached. Upon recognizing this sequence the modules download control protocol starts a download control program. This action begins accepting program data and placing it within the operational controllers program memory. The instructions thus supplied will control operation of the platform module during deployment. More than one control processor may be present on an operational platform bus.

The software development station controller can communicate with any addressable device on the serial data bus or parallel data bus during development, programming or operational testing. Within this environment platform modules may be calibrated, diagnosed, queried, programmed or developed. These busses carry signals and are not the same as the serial and parallel power buses.

When a modular platform is equipped with an actuator the actuator may be used to trigger or control other devices. Various styles of actuators can be fitted to a module to perform needed tasks. One such actuator module is used to control guidance airfoils when the platform is dropped from an aircraft.

Each platform controller and some modules contain a unique address that is used during communications. The communication modules implemented on the modular platform can be delivered by radio frequency, ultrasonic, laser or infrared light or any other method for which a module can be created.

Applications

The modular platform can be assembled to meet the requirements of a large user community. Long term missions can be equipped with specialized batteries or solar assisted battery modules.

The form factor of the platform provides an aerodynamic shape that is compliant with an air delivery and placement scenario. The shape of the weather tight enclosure can easily be fitted into a shock absorber module to absorb air drop impact. The shock absorber may also use a spike to penetrate the ground on impact and there-after provide support for the platform and keep it in an upright position.

If a platform is placed high up on a shaft that is fitted with a weighted end near the ground impact end the module can be positioned above surrounding obstacles and thereby gain the advantage of a longer, line of sight, or surveillance area at the landing point.

The modular platform can be fitted with sensor heads to measure wind, temperature, pressure, infrared, movement, sound, seismic and any other data that can be sensed using today's and tomorrow's technology.

Basic modules that could be anticipated to be useful include a variety of battery or power supply modules. A battery module may include solar cells, alternate battery charge/use switching methods, low level isotope excited power supplies, or whatever the newest technology is that becomes available.

Other modules would include but not be limited to, software controlled micro-controllers, various communications modules, memory modules, amplifier modules, low power receiver modules, specialized antenna modules, platform container modules, impact shock absorption containment modules, video collection modules, underwater power generation modules, ultrasonic, sound, GPS, seismic, smoke detection, chemical detection, gas detection, radiation detection (nuclear) module, intelligent munitions, control modules, or whatever mission support may be required.

Figure 19B:
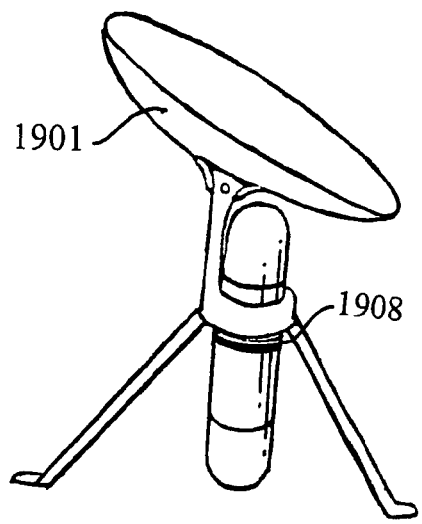
FIGS. 19, 19A, 19B, 19C, 19D and 19E show a few associated platform support tools and features and illustrates the utility of the raised threads on the outside of the platform. A video platform is shown with a flashlight module affixed to it to provide a flashlight and digital camera capability.
Figure 19C:
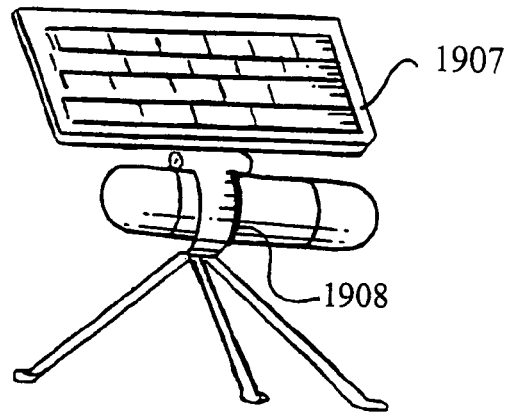
Figure 19A:
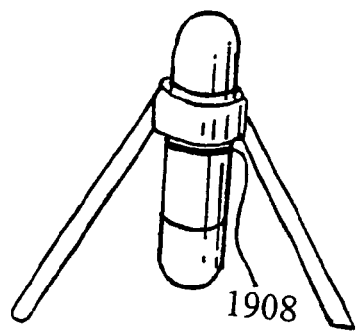

The outside of the platform may be affixed with various fittings to extend and enhance versatility as shown in FIGS. 19, 19A, 19B, 19C, 19D, and 19E. The raised threads 1908 as shown in FIGS. 19A, 19B, and 19C, facilitate applying special mounting enhancements, such as enhancement 1901 depicting an antenna and a support stand as shown in FIG. 19B.

Figure 19D:
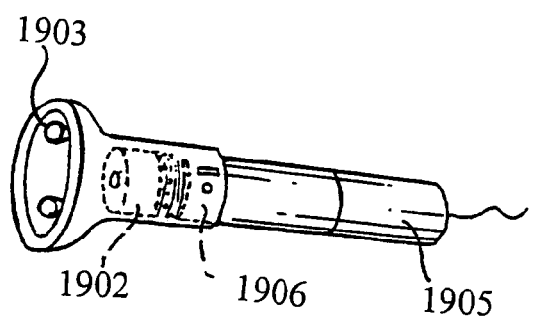

FIG. 19D depicts a hand held flash light 1902 with a built in digital camera Charge Couple Device 1902. Light bulbs 1903 around a common flashlight reflector provide illumination of a subject area. The camera module is attached to an interior command and control module 1906 which provides communications via the small antenna module attached to the battery module 1905. The flashlight camera module fits onto the controllers end-fitting and passes digital data from the CCD 1902 over the bus to the controllers memory. The image may be saved as well as sent to another platform. This may be useful for watchmen, police officers at crime scene, surveillance, surveys, etc. The light may be turned off during the day and the camera will function without auxiliary lighting.

Figure 19:
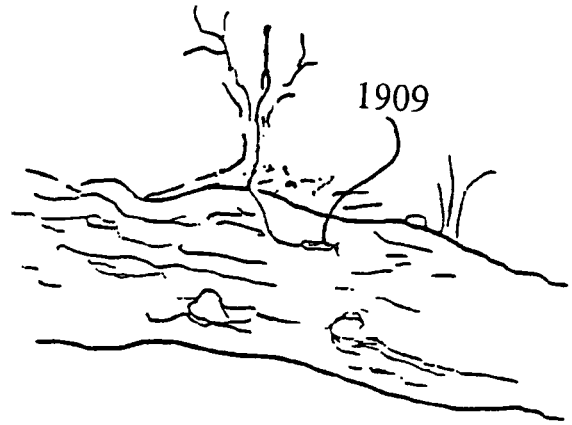
Figure 19E:
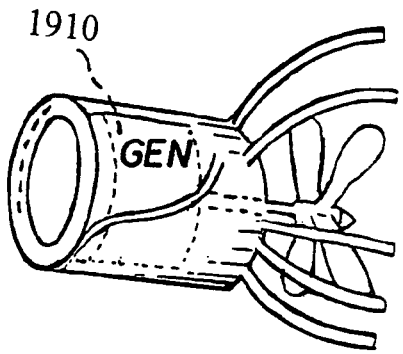
Figures 20, 20A, 20B:
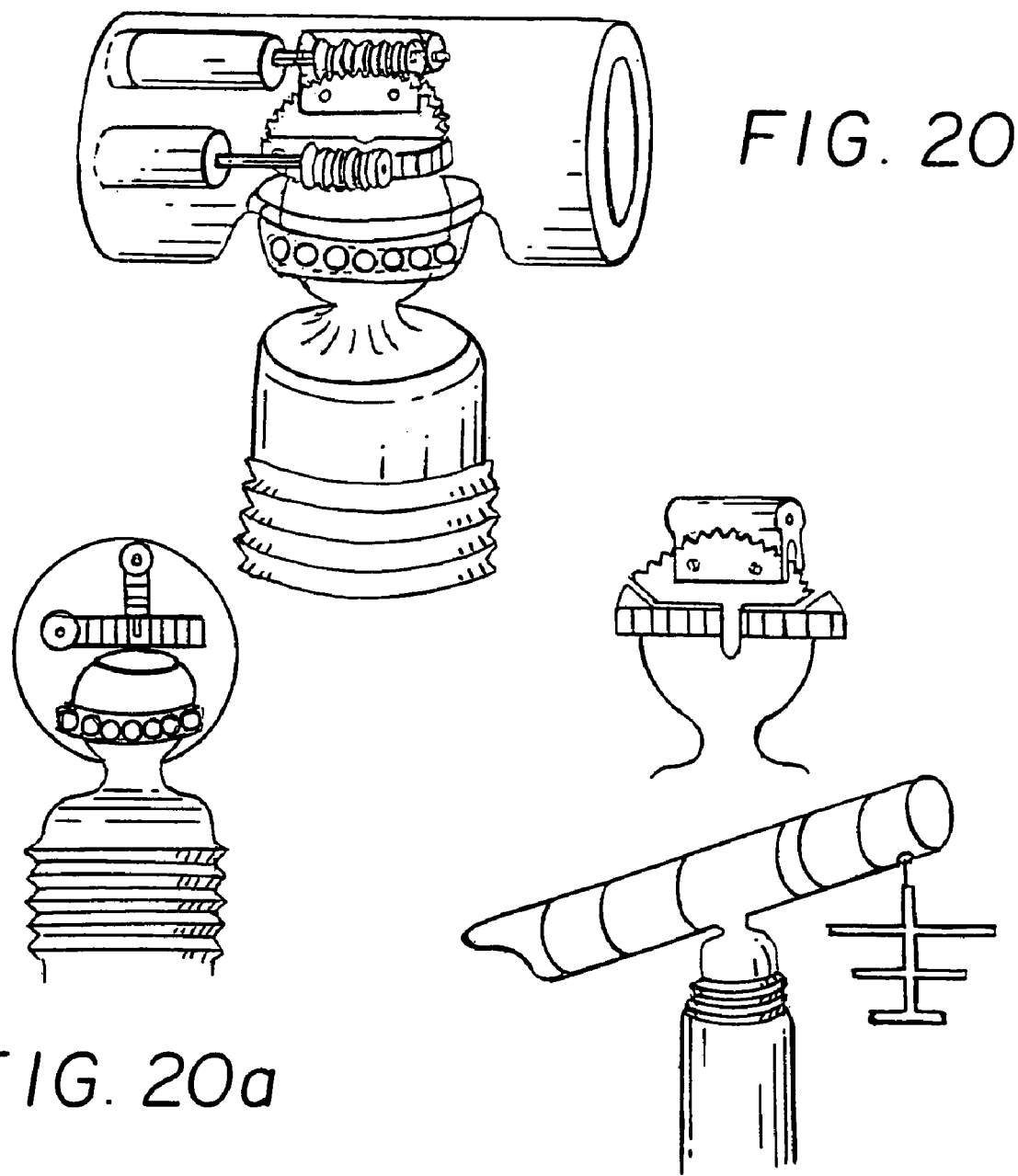
FIGS. 20, 20A and 20B depict a module that can be included in the platform to create the capability to control the angle and position of the assembly via remote commands. The positioning module uses the standard end fittings to accommodate the other modules as needed. An antenna module is shown affixed to the platform.

FIG. 19C depicts a platform 1907 with an attached stand and a solar collector. Two panels can be used to create a sloped roof over the platform. The raised threads on the outside of the modules 1908 make mounting and inter-operation with other equipment easy and adds greatly to the versatility of the architecture. FIG. 19 illustrates a platform 1909 submerged under water in a stream. The FIG. 19E module 1910 is a power generator with a small propeller on its end. The propeller is protected with bars or a mesh to keep debris away from the propeller. This underwater platform supplies support for a camera or other sensor that is placed on shore and perhaps concealed. This provides a very long life cycle for the installed sensor. The sensor platform may have a radio frequency transmission line extending from the sensor out of water onto dry land and terminating at an antenna, wherein the sensor sends radio frequency messages to receivers over the transmission line. The sensor platform may further comprise a power generator for developing electrical power. The power generator may be driven by torque from a propeller, with the propeller being rotated by water current.

The bus structure of the modules can be provided with very few tracks. A serial bus requires only two or three wires to pass clock control and data signals. There are many integrated circuits that are on the market that operate on a serial bus. The two bus lines are for carrying a clock signal and a data signal. There are several protocols, used to implement serial buses, available today. Phillips Incorporated and Motorola Incorporated are two vendors supplying integrated circuits that operate with serial bus protocols. Prototype testing related to this invention was carried out using the Inter Integrated Circuit Communications protocol. By using a standard bus structure within the modular platform it is possible to easily incorporate new developments.

Design

Figure 4:
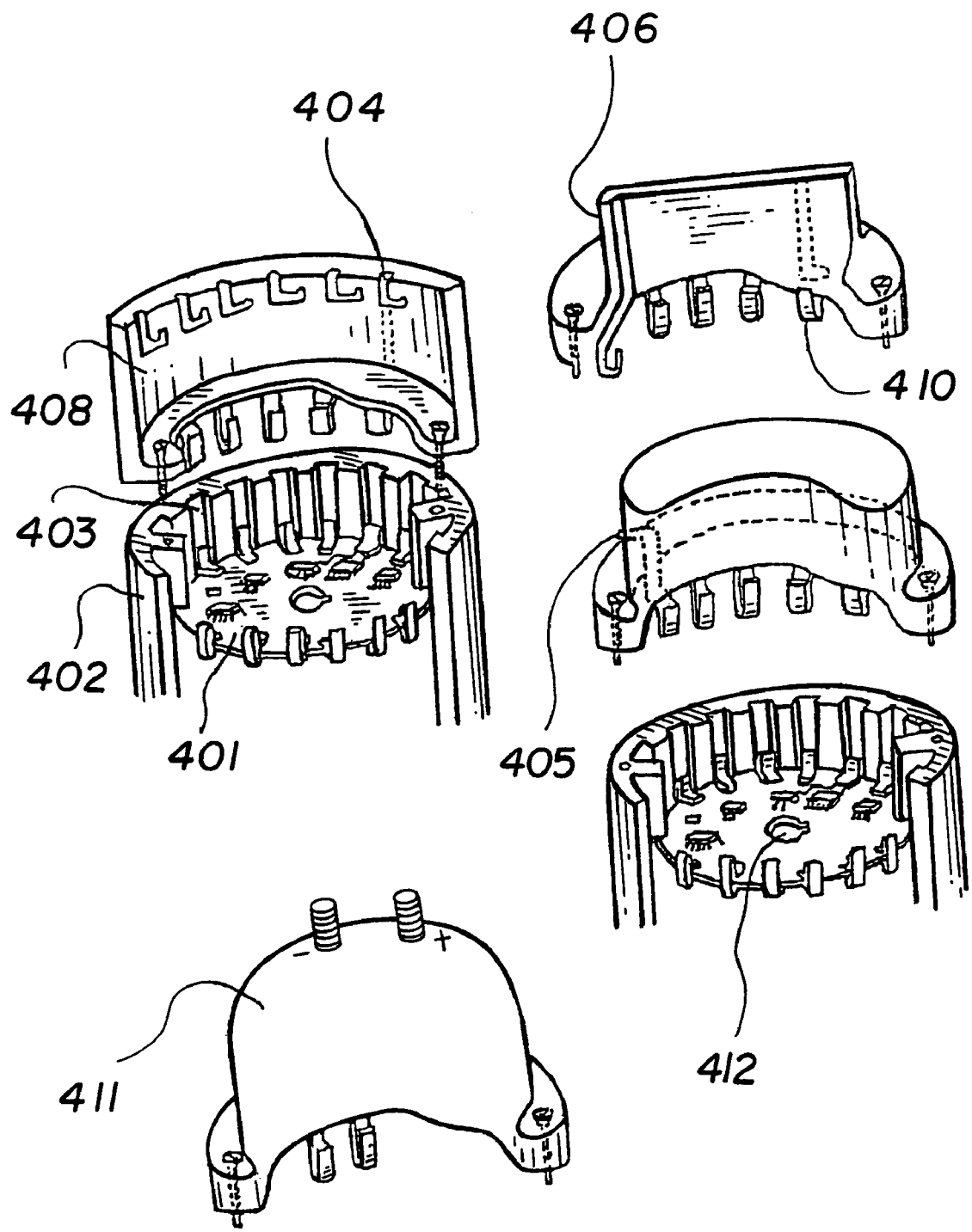
FIG. 4 depicts the structure of a modular platform that is employing the in wall bus embodiment. Dry contacts are also shown on a terminating module.

Internally modular platform modules comprise circuit boards that are fitted to the internal shape of the module. FIG. 4 depicts a circular circuit board 401 in the internal space of a controller assembly 402. The circuit boards are fitted with electrical contacts that slide into the in-wall bus tracks 403 when the boards are installed in the module. It can be seen in FIG. 1. that three modules are included in a basic system; command and control, power supply and sensor/actuator head. 103 shows a command and control module, 101 is a sensor head/actuator module and 104 is a power supply module. In this configuration it can be seen that the modules are joined together by inserting a male end fitting 102 into a female end fitting 105 and, while applying insertion pressure, twisting the modules together. This will bring the contacts 106 on the end fittings into electrical communication.

A circular circuit board and cylindrical enclosure is preferred but other shapes are also capable of providing a modular architecture. Electrically conductive tracks are present on the internal surface of the module to provide an electrical bus over which the circuit boards within the modules will communicate. A fiber optic bus may also be used. A fiber bus may carry signals to reduce the radiation from the device when processing sensitive data and make the device harder to discover using an electrical detection device. A stack of circular circuit boards wherein each of the boards comprises a center circular void and wherein the stack provides a center passage. The stack of circular circuit boards may further comprising a hollow post passing through the center passage for adding support to the stack of circuit boards. The stack of circular circuit boards of may further comprise lenses configured for optical focusing of light onto sensors. The stack of circular circuit boards may further comprise a hollow support post with signal transfer bus tracks to connect circuitry on the circuit boards. The circuit boards are in contact via signal contacts on a periphery of the center circular void. The signal transfer tracks may be comprised of superconducting material and liquid nitrogen that is circulated through the hollow support post for cooling the tracks to superconducting temperatures. The stack of circular circuit boards may further comprise a telescoping antenna within the center passage. The stack of circular circuit boards may further comprise a laser beam operation space in the passage.

The circuit boards comprise micro-controllers, memory, amplifiers, switches, digitally controlled potentiometers, spread spectrum communications circuits, encryption, oscillators, frequency synthesizers, crystals, etc. As the art improves improved circuit boards will be developed to integrate the improved capability and be substituted on the standard bus. In this way the modularity is extended to the board level.

Figure 5:
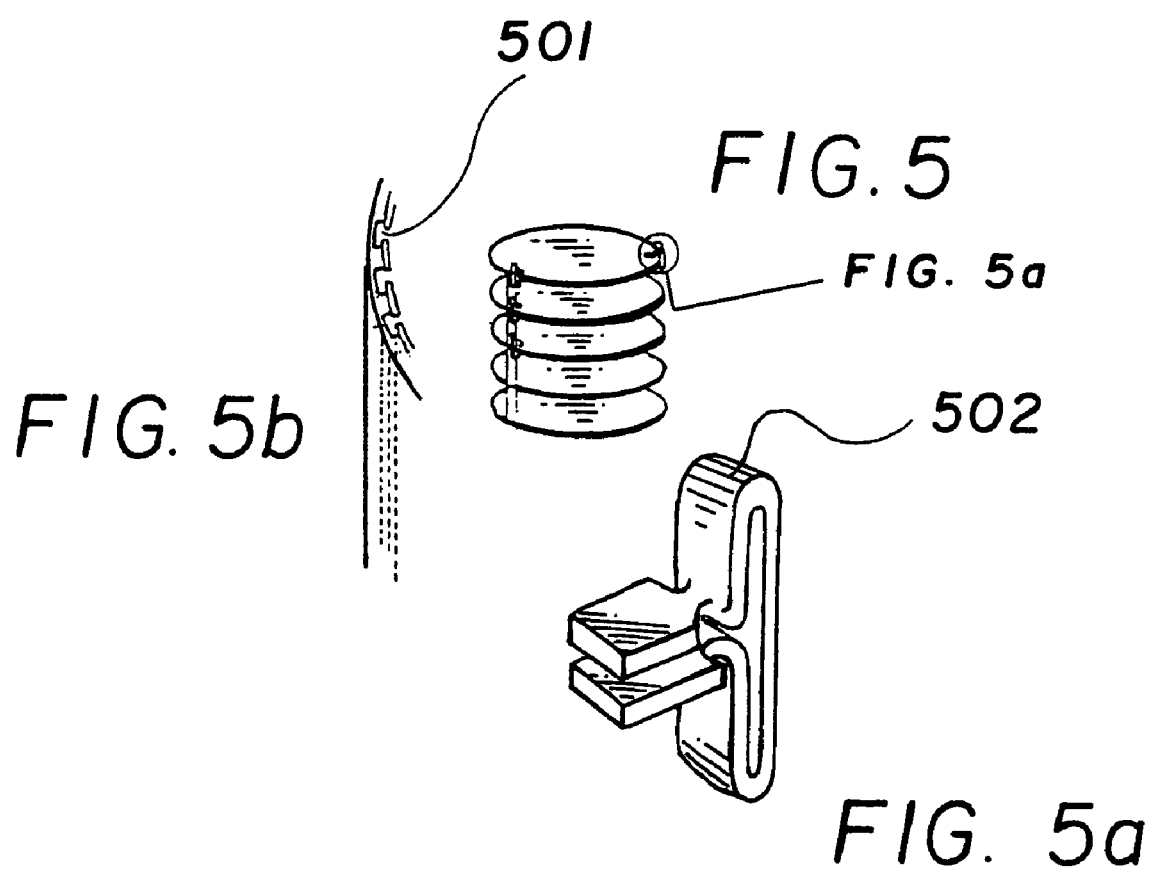
FIG. 5 depicts another embodiment of a modular platform comprising in-wall circuit tracks.

One embodiment of the platform, shown in FIG. 5, comprises in-wall tracks which are placed within channels along the inside of the module from end to end and are terminated at electrical contacts which pass through the end fittings and are exposed at the outside of the end fitting. FIG. 5B depicts a cross section top view of the placement of channels 501 inside the module wall in which electrical tracks are placed. The electrically conductive tracks accommodate circular circuit boards which are fitted with elongated contacts 502 (FIG. 5A) around the circular board perimeter. The circuit board circuitry thereby is connected to the electrical bus tracks on the inside wall of the module via the elongated contacts.

When a platform module is fitted to another module the end fitting contacts are brought into electrical communication and an electrical path is made between the bus tracks of each module. The tracks are the bus structure of the platform over which data, control and power is passed.

Figure 6:
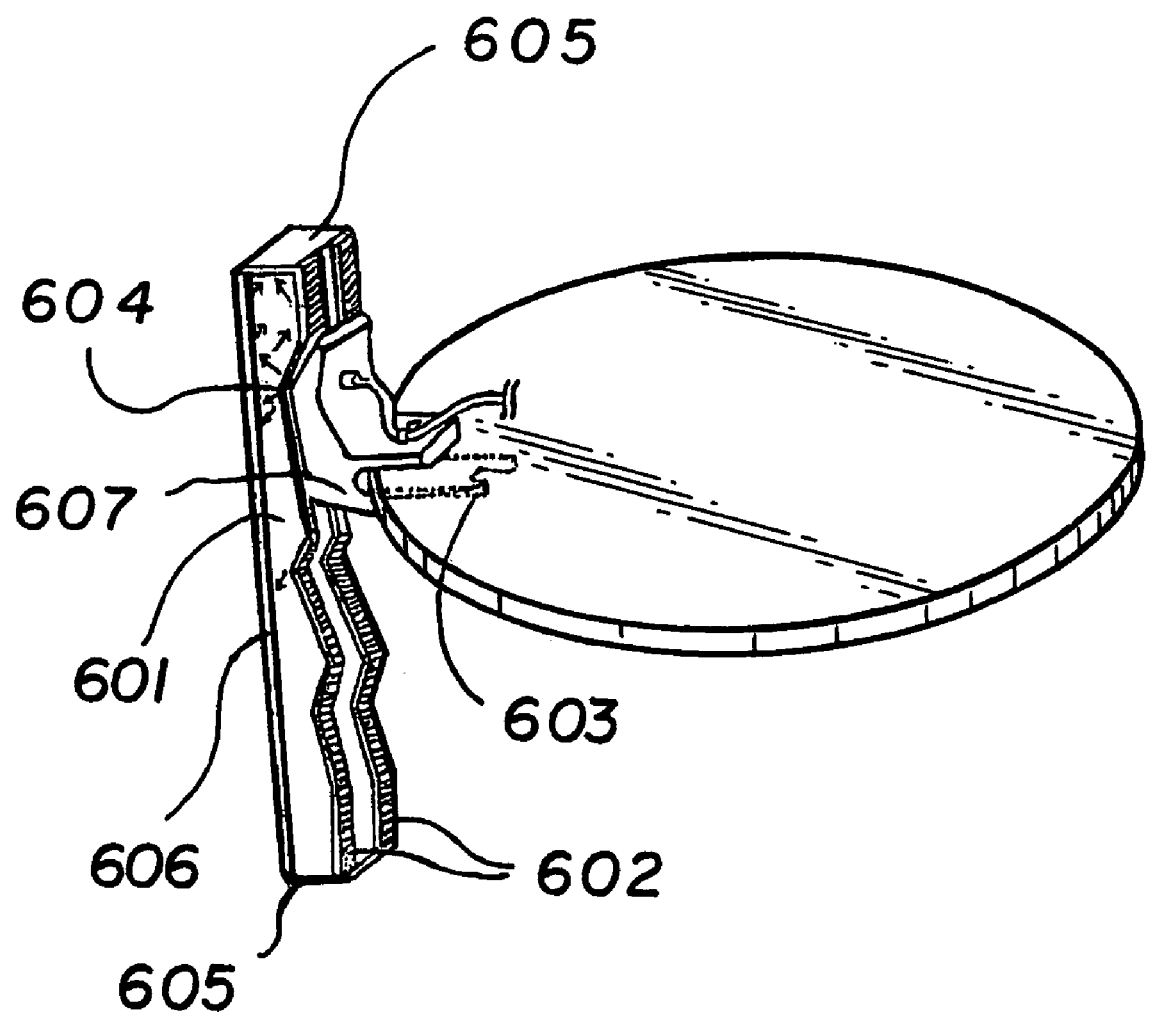
FIG. 6 represents a signal interface using a strip of fiber optic as a bus track with two electrical conductors and a connection to these by a connector that picks up light from the optical track and electrical signals from the conductor. The connector is mounted on a circuit board.

One special high speed circuit board contact type is combines metal trace electrical contacts with fiber optic communications techniques. This type of connector is used where very large volumes of data are processed. The contact type shown in FIG. 6 illustrates the configuration of the contact type. The tape like track is comprised of light conductive material 601 that is combined with copper traces along each side of the track 602. The electrical conductors carry control signals and the light tape will carry data in this implementation of the connection. The light tape can be used without the metal electrical carriers included. The two metal electrical connections of this connector are soldered to the bottom of the circuit board as shown in 603.

A flat tape like light bus is terminated with a light absorbent material on each end 605 to reduce reflections from the bus ends to reduce noise and thereby improve the correct data's signal to noise ratio. A reflective coating is provided on the back of the light tape 606 to reduce absorption of light delivered to the bus. This same coating exists on the back of the electrically conductive strips where they are joined to the light bus. The bus may comprise a flat ribbon of transparent material terminated on both ends with a light absorbent material to reduce reflections, and a surface coating of reflective material on the flat ribbon's non-connector side to enhance reflections. The ribbon may comprise v-shaped notches along the ribbon length. The v-shaped notches are placed to mate with v-shaped probes made of transparent material fitted into the notches to absorb light signals traveling on the bus and also to project light signals onto the bus.

The connector mates with the light bus at an indentation in the bus as shown in 604. The connector is wedge shaped to fit closely into a wedge indentation and directly places a light conducting material that is embedded in the connector in close proximity to the indentation on the light bus. The point of contact is angled to emit light in both directions on the bus when transmitting and collecting light from both directions to receive on either side of the connection point.

A fiber optic cable is used to transport the light signal away from the point of light pickup on the connector into the appropriate circuitry on the circuit board which will process the signal. Embedding a light conductor into the connector body is another embodiment of the connector. The light bus connector is held in place against the light tape bus by spring pressure developed by soldering the tabs 603 and inserting the circuit board into the casing of the module into which it is to operate.

The light bus connectors around the circuit board are pushed into the grooves within the body of the module and the close tolerance develops opposing pressure against the module wall pushing similar connectors in juxtaposition into the opposite side of the wall consequently developing a counter force. Spring action is derived from the connector material flexing at the location indicated by 607. As the circuit board is pushed into the cylindrical enclosure, the contacts will flex as the board is pushed from top circuit board positions toward the bottom circuit board positions. The connector will enter a home position at each circuit board position as it is pushed along the in-wall bus.

End-fittings

In FIG. 4, 404 illustrates the placement of female electrical contacts and 405 illustrates the location of male electrical contacts that are present at the end-fittings. 403 depicts the inside track on the inner surface of the module with which the circuit boards and end fittings make contact. In order for the modules to be fitted together a male and female end are joined. A variety of end-fittings can be developed to produce capabilities. An end-fitting 1604 (FIG. 16) that comprises an edge connector 406 can provide a simple interface to other assemblies based on traditional square circuit boards. Both a female end fitting 406 and a male end fitting 407 can be used for module interconnection. The end fitting is equipped with contacts 410 that slide into the tracks within the cylindrical case. These contacts pass through the body of the end fitting to the exterior to provide electrical contact points on the outside of the end fitting. The outside contact points 405 and 409 are the module electrical inter-connection means.

Another embodiment of the end-fitting is shown later. The exact form can be varied to accommodate better methods, practices and material.

Terminating modules which attach to the end of a platform have only one end-fitting. An example might be the battery module which would be on the end of an assembly. The module 411 is a terminating module that provides two terminal posts that may be used to control something outside the platform.

Internal or (inside) modules have two end-fittings. More than one internal module may be fitted together to provide extended functional capabilities as needed.

The modules are joined at the male/female junction. The male fitting of a module is fitted to the female mechanically and electrically. The mechanical connection is made by fitting the male end-fitting that is of a smaller diameter than the rest of the module into the female fitting that has a recessed area to allow the male end-fitting to be placed into it.

Within the female integrated end-fitting, on the internal vertical wall of the recessed area are acceptance channels 409 that contain the extensions of signal, or bus, tracks from inside the module in-wall track 403 which pass through the end fitting to the exterior of the module end-fitting.

The acceptance channels 409 are a means to receive and guide protruding electrical contacts 405, which are electrical extensions of the inside module electrical bus. The contacts pass through the enclosure material, and protrude from the male end-fitting.

The acceptance channels 409 extend a small distance down in line with the length of the module and then turn 90 degrees, and extend a small distance horizontally and finally the channels extend upward a very short way toward the top of the female fitting wall.

Assembly is accomplished by aligning the protruding contacts on the male integrated end fitting with the acceptance channels of the female integrated end fitting and pushing the modules together until the protruding contacts reach the bottom of the vertical run of the acceptance channel and then twisting the male end fitting contacts in the direction of the horizontal run of the acceptance channel and then releasing the pushing force. This connection may be a Bayonet form. In this position if the insertion pressure on the module is released the male contacts will be pulled up into the very short acceptance channel in the vertical direction back toward the top of the female end fitting.

The pushing force that is applied when assembling compresses an O ring 107 (FIG. 1) and therefore when the pushing force is released the expansion of the O ring pushes the male end-fitting protruding contacts up into the very short acceptance channel. The 'O' ring 107 also serves to seal the connection from weather damage and maintain the contacts in position in the very small portion of the groove that returns in the upward direction. This connection technique may also bring light carrying tracks into communication.

To develop a strong mechanical bond non-electrical protrusions from the male portion of the end fitting are fit into mechanical acceptance channels of the female module wall. The larger size of these protuberances provide a keying means to index the connector to the proper electrical alignment for the bus contacts. The path of the tracks that accommodate these protuberances follows the same path as the electrical acceptance channels.

The circular circuit boards comprise an opening at the boards center 412 (FIG. 4). This opening is in place to provide certain platforms with a bus expansion area, a camera focusing range, a laser pass through space, a telescoping antenna, a drive axle for rotation of actuators and sensors and descent guidance modules, a projectile, a coolant plumbing passage, etc. This Applications Expansion Hole is fitted with mission oriented attachments. The opening is also utilized and engineered for high volume manufacturing techniques explained later.

This application's expansion hole space also will accommodate a hollow post 701 (FIG. 7) that has a threaded bottom end which is screwed into a support nut 702 at the bottom of the module. This hollow post provides a variety of functions. It will provide structural support to the circuit boards when the circuit boards are equipped with Indexing and Support Bushings 801 (FIG. 8). The requirement to provide circuit boards with the bushing and post support system is mission related. Some missions require that the platform be hardened to survive a deployment methodology such as air drop or trajectory placement techniques.

The bushing is used between the circular circuit boards to maintain spacing between the circuit boards. The bushing is mounted solidly to the circuit board in order to stabilize the board when used in conjunction with the mounting post. When the circuit board support post is in place the stabilizer bushing 801 may be attached to the board at its center to provide stability and maintain the circuit board in a level position as well as maintain correct spacing between boards.

Figure 2B:
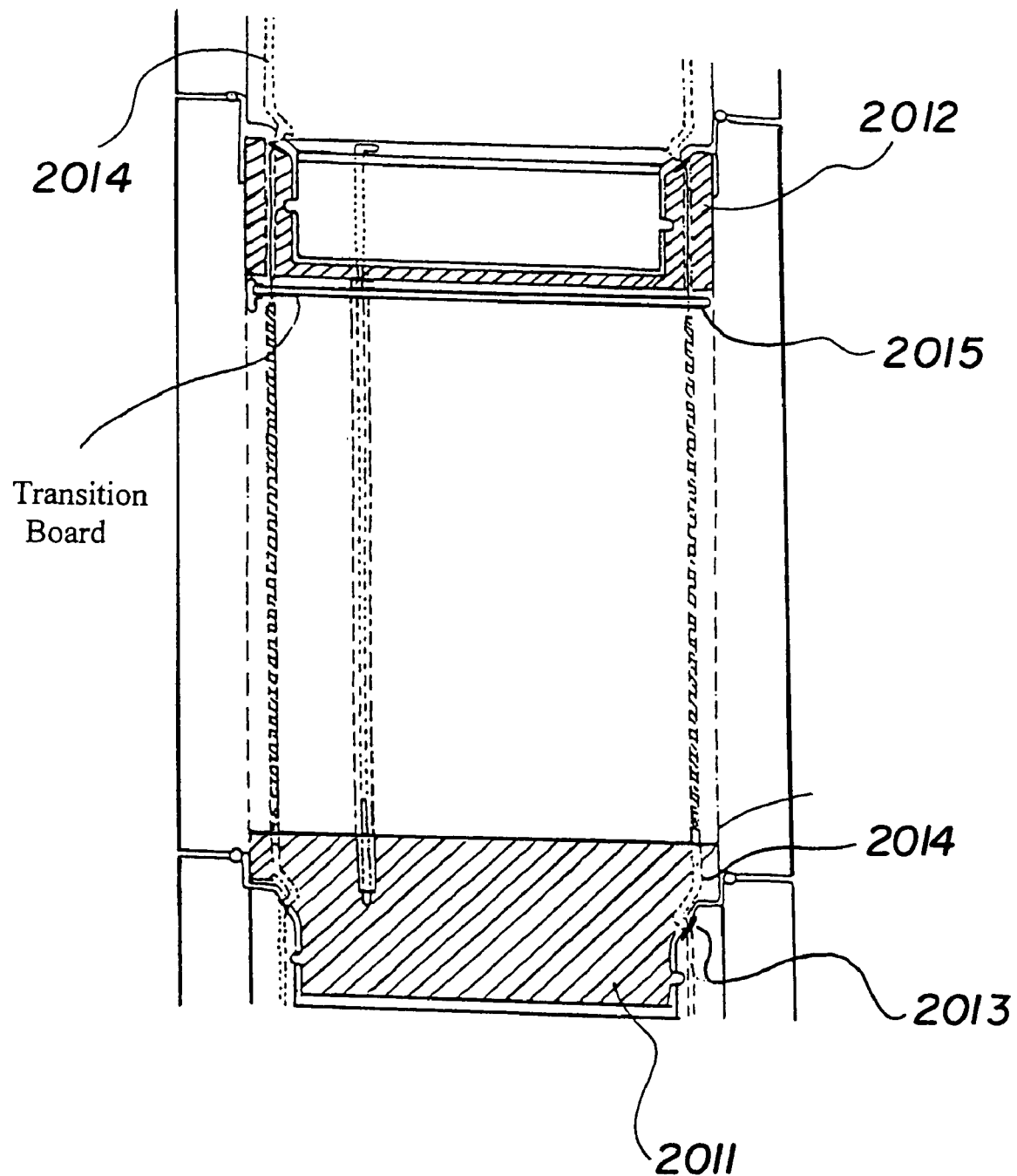
FIG. 2B depicts a partial view of another embodiment of the modular sensor platform.
Figure 3:
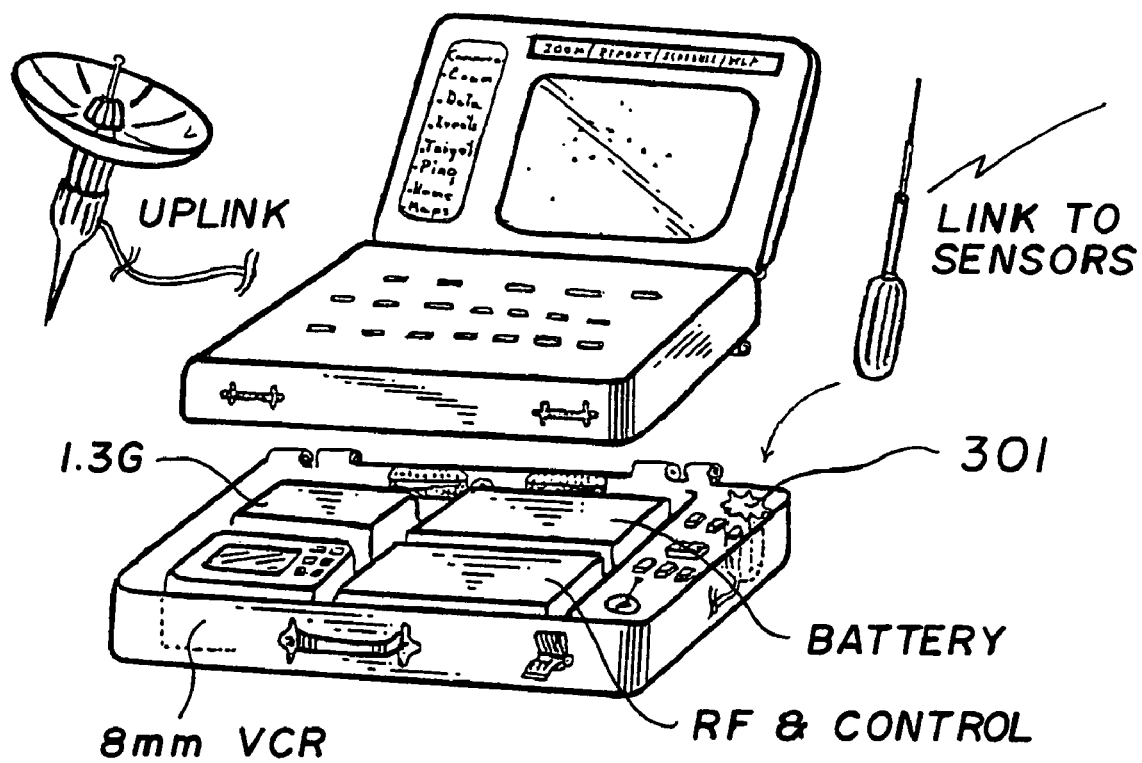
FIG. 3 shows a test and development computer system that is equipped with a standard end-fitting onto which a modular platform may be installed. This station also will operate as a field support unit to monitor a field of sensors. The capability relay information from the sensors to a satellite is also within the station's capability. Video tape storage records information from deployed video sensors that are equipped with camera modules.

The connections within the platform can be made in a variety of ways. One method is illustrated in FIG. 4 which uses contacts that slide into bus tracks that are in channels on the internal wall of the enclosure. Another embodiment is illustrated in FIG. 2B. This form is more conducive to manufacturing. The male end fitting 2011 and female end fitting 2012 comprise connections with contact points that are exposed to provide the external electrical connection points to other modules. Two appearances of electrical contacts in the fitting are used, one flat contact 201 (FIG. 2A), 2013 (FIG. 2B) and one protruding contact 202 (FIG. 2A), 2014 (FIG. 2B) which pushes against the flat contact of a module connection. As shown in FIG. 2B, these contacts pass through the end-fitting and appear inside the enclosure where they are pins which penetrate a circuit transition board 2015, adjacent to an end fitting 2013. The circuit transition is from the end-fitting to the circular circuit board which is aligned with other circular circuit boards, not shown. The stack of circuit boards will be wrapped by a flexible circuit motherboard (FIG. 14A) 1401 which provides an electrical bus for interconnecting the module electronics. Other end-fitting means can be constructed and the method may change in response to requirements, e.g. the required number of connections, consideration of water pressure, heat conditions, material used and other mission-related requirements.

Later in this disclosure the scale of the platform is much larger than a typical sensor support platform.

The center opening can also be used to provide cooling for the module when needed. The arrangement of the circular boards is ideal for super computing applications. The distance of input/output components from the bus can easily be kept the same on every board which serves to eliminate signal racing conditions that are so important in super high speed computing.

We can circulate air or pass coolant through the inner area to pick up and carry heat away from the internal areas of the assembly and recirculate or replace the cooling medium. When extremely high speed super performance features are required the coolant may cool auxiliary bus tracks on the center post bus that are made of super-conducting material to very low temperatures.

The modular platform may also be equipped with a power supply that produces electricity from a thermopile heated by a nuclear isotope. This power source is used on long deployment missions to produce electricity, Ref JPL & NASA Case No. NPO-18042.

An important requirement for the platform in some applications is that the cost of production be held low. To accomplish this a method of manufacture is required that can be automated. To accomplish high production and minimal cost the hole in the center of the circuit boards of the modular platform is employed to create a highly automated method to manufacture electronics platforms.

Evolution of circular circuit boards and cylindrical enclosures will result in integration of highly useful functions into LSI, Large Scale Integration, application specific integrated circuits. These chips will comprise more and more of the circuitry of a single board until complete integration of the board is accomplished. At this time in the evolution the body of the integrated circuit package will be circular. This circular component will be mounted inside a circular chip carrier. Eventually the circular integrated circuit chip would be placed directly into the cylindrical platform creating a very high level of electronic integration in a small tube.

An extension of the mass manufacturing embodiment which uses the center hole of the circular circuit board may also be utilized to assemble the silicon dies of the integrated circuits to assemble the dies into a stacked assembly. The circular circuit dies could also be assembled using the center hole to accommodate a robot grip automated assembly and alignment. This technique would require the actual circuitry on the die to be etched around a hole or the silicon die could be placed off center.

A multi-layer flexible circuit board can be used to enclose the circular circuit boards to serve the purpose of a motherboard. This embodiment will provide a method of manufacture that is highly automated FIG. 14. The flexible board may be wrapped around the circuit boards by heated rollers that heat solder present on the flexible board and thereby join contacts on the perimeter of the circular circuit boards to the flexible circuit board. This manufacturing process is an object and advantage of the circuit boards comprising the center hole. The center hole will accommodate a rod passing through all the boards to stabilize and align the boards during the heated roller joining process. When the rod is controlled by a robot the assembly can be automated by manipulating the robot to select the circular boards from feed points by inserting the rod into the hole on the board, and thereby select the proper set of boards which would then be placed into the heated roller mechanism for soldering.

In FIG. 7, 703 shows index rails that are on the internal wall of the module. These index rails provide an alignment means for placing the circuit board in the bus tracks correctly. The index rails are fitted with screw holes on their ends to allow cover plates to be secured by inserting screws at the screw points after the circuit boards have been installed and a cover is put in place. The cover plates can also be ultrasonically welded if extreme exposure during deployment is anticipated such as underwater use.

It can be seen that the modular platform produces a general capability to deploy a variety of sensors and actuators which can be supported by the architecture of the modular platform. Finally support personnel can become familiar with a basic platform and the data fusion systems that are related to data collection.

A service person may become proficient with the internal working principles of the generic platform and thereby become proficient at providing support for a system that supports many users and mission areas. This can lead to an economy of scale and improve the support structure beyond what is practical for dedicated mission specific systems. When such a system is in place for an extended life cycle ancillary operational systems and support programs can be developed to even further enhance capabilities.

In consideration of dropping the modular platform from an aircraft into a data collection area several other modules are available.

Figure 10:
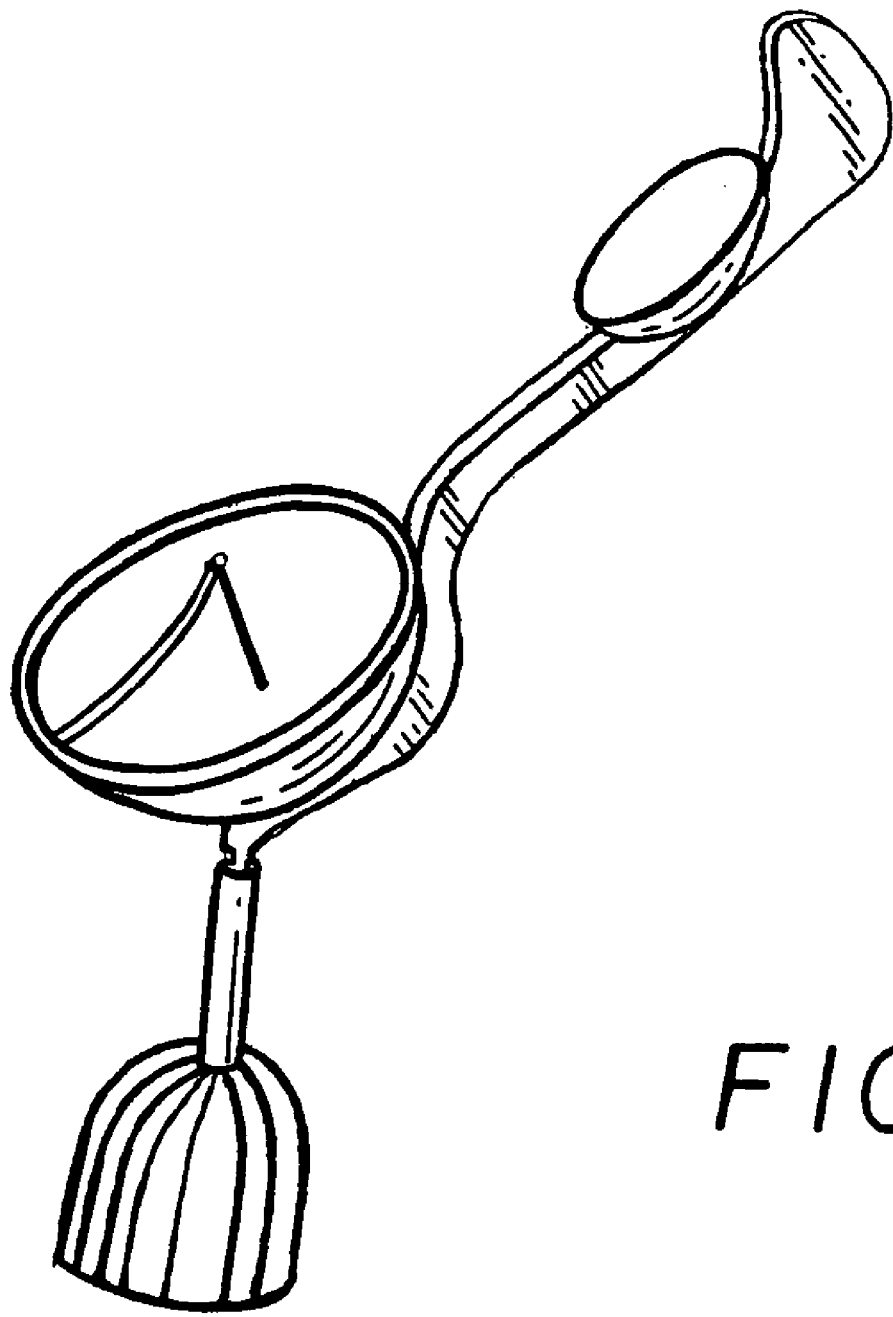
FIG. 10 depicts a module that has affixed to it an aerodynamic fixture to slow and guide a modular platform when it is falling through the atmosphere.

A terminating module for the platform upper module and one for the lower module is used to enhance air drop capabilities. The upper module is provided with a parabolic shaped air brake FIG. 10. The air-brake will slow the rate of descent of the modular platform in the same manner that a parachute slows rate of descent. The air brake is attached to the terminating module which will be the uppermost module when the platform is resting in it's vertical operational position. When on the ground the parabolic shaped air brake is repositioned to produce an antenna. The parabolic shape is commonly used within antenna systems and is also used for concentrating other energy forms that may be oriented to a mission, such as infrared light, ultrasonic, audio, etc.

When the platform is descending the air-brake is derived by placement of the air deflector horizontally in relationship to the axis of the platform. When the modular platform is in place on the ground the functionality is as a parabolic reflector wherein the axis of the deflector is repositioned in respect to the axis of the modular platform by the guidance actuators, using conventional positioning techniques. The positioning information is supplied to the actuators by an internal command and control processor module, via the system bus.

Another factor of dropping the modular platform from the air is accuracy of placement. The proper placement of the platform will in many cases be critical to the data collection effort. To aid in the placement two terminating modules are used. Viewing the modular platform when its axis is vertical the terminating module on the top and the bottom of the modular platform are capable of aiding in accurate dropping of the modular platform.

The lower terminating module is equipped with an optical sensor that is sensitive to a target indicator illuminator; a source of light to which the sensor is responsive. As the modular transport falls through the air the optical sensor locates the light source position on the target of the drop. The sensor places the target's position data on the modular transport bus where it is available for processing by ancillary modules.

The upper module of the guided drop scenario is a guidance module. This module is equipped with actuators that deflect air during descent to make adjustments in the direction of descent to reduce the eventual distance from the intended drop position and the actual drop result. The actuators of conventional missile guidance techniques using servo or stepper motors to control airfoils or for small modules the air deflecting surfaces may be constructed of bimorphic material that changes its shape when subjected to electric current flow. When laminated into appropriate thickness this material will produce sufficient deflection strength to guide a small module. Samples of this material are available from AMP Inc. The same piezoelectric material is used as sensor components.

Within an air deployment activity several types of guidance and landing target position sensing terminator modules may be used to accommodate special conditions. Fast drop low profile missions may use very little descent braking and instead use impact shock absorption features for the lower module. Very sensitive electronic payloads may require reverse thrust capability to guarantee soft landings. The modularity will enable treatment of special conditions as required.

The cylinder shape of a platform can be made to be more robust and survivable than the conventional square computer box which features rattling circuit boards, multiple internal connectors used to tie other boxes together, like the typical power supply box, the floppy disk box, disk drive box, etc. The herein suggested form factor is superior in many ways but very much so in terms of reliability and survivability in harsh environments. In addition it is versatile and modular and can provide a foundation for a long-term investment program, which is the typical form in utility service investments.

Changes in Scale

The size of a modular platform can be scaled to a mission or application. The cylinder shape derived from assembling modules renders a high durability, robust, weather resistant computer, making placement of computing capability in harsh environments possible.

Figure 11:
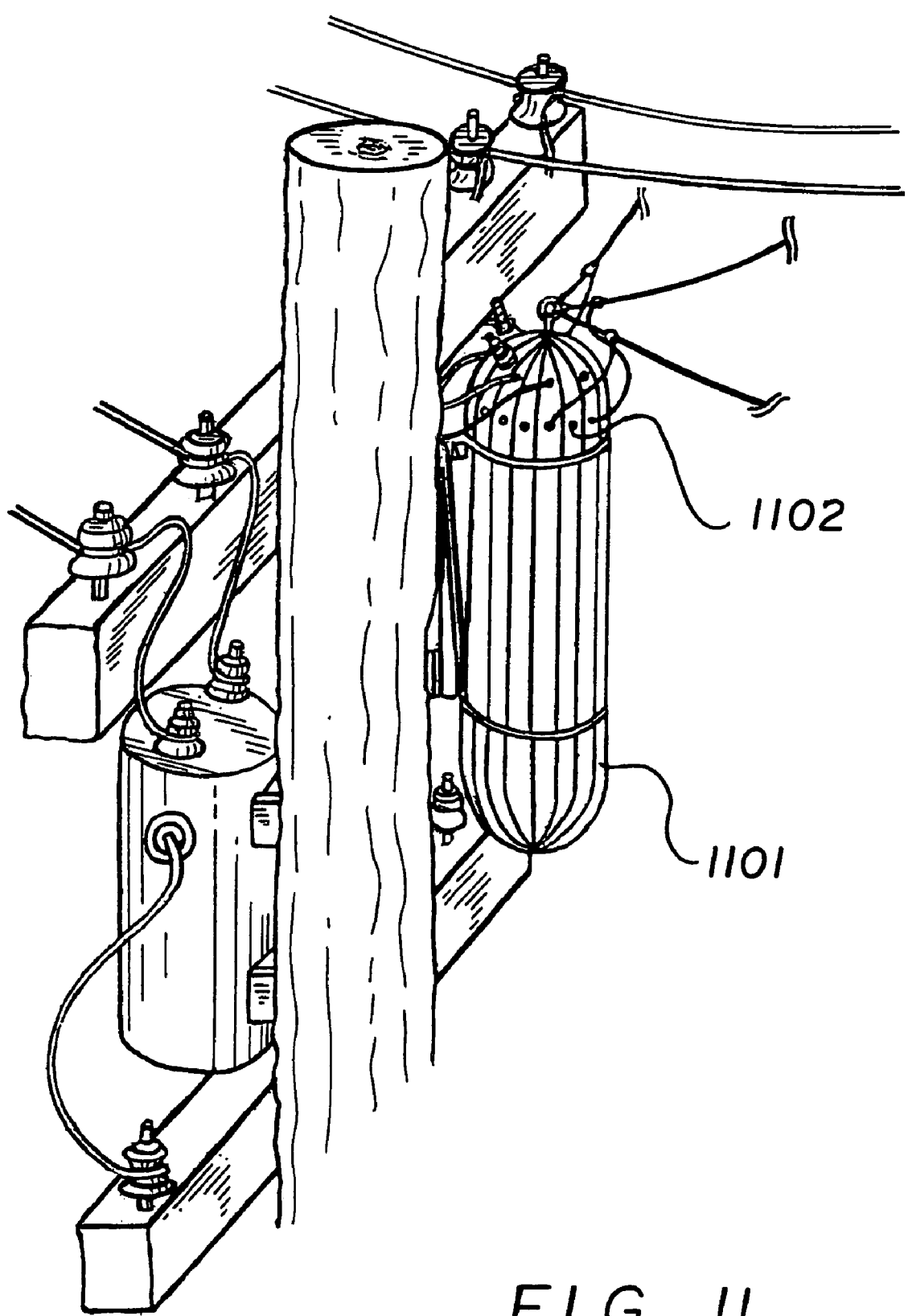
FIG. 11 depicts a scaled-up modular platform shown affixed to a utility pole and functioning to provide computing services to residences and businesses. Three modules are shown.

One application that yields vast advantages is placement of the modular platform cylinder on utility poles to provide communications and computing services to surrounding buildings and/or residences FIG. 11. In such an implementation the cylinder platform would be equipped with a disk drive module 1101 for mass storage. The software multi-user operating system would provide services to terminals or personal computer users housed in nearby buildings or residences. In this installation the sensor head terminating module, usually on the top, is replaced with an interface connection module 1102 to connect the platform communications lines. The modular computing platform pole unit can be networked to other units. A modular computer architecture may comprise a distributed architecture comprising scalable weather resistant computer platforms that are interconnected to operate as a digital grid, thereby connecting multiple processors and peripheral nodes within a neighborhood of user residences and office buildings. The digital grid may execute a Beowolf multi-processor operating system transforming the digital grid into a supercomputer capacity utility connected to users to provide digital services to residential digital devices and whereby upgraded capacity can be obtained by installing more servers on the digital grid. The distributed architecture may wireless high speed access points to provide convenient locations throughout a neighborhood where high speed wireless service is available from communications servers. Residential computing capacity can be installed to interface residential digital services with neighborhood digital servers. The architecture is connected using media types selected from the group consisting of fiber optics, infrared signaling, coaxial cable, twisted pair, wireless, and lasers. The scalable platforms may be structured to meet mission specific functionality by configuring modules on platforms to apply resources required as needed. The mission specific functionality may be a data storage platform; a multi-processor platform; a wireless access platform; or an external networks communications interface server providing protocol conversion and connections to networks and resources external to the grid. A modular computer platform may comprise (a) a parent device comprising a data processing means wherein computer instructions are executed, and a data storage means for storage of a control program and data, and (b) at least one slave that monitors events and activates a radio frequency communication link to contact the parent device. The parent device operates as a master in a communications protocol with the slave wherein the slave requests at least one service from the master parent device.

The external connection interface module will provide fiber optic, or other media type, connections to resident computer users of the system. This pole mounted computing facility could also be networked with metro cable systems to acquire broad band communications.

When necessary the size of a platform is customized to the level of computing power required. A modular platform utility pole computer would be much lighter than the common electrical step-down transformers used in the power distribution system. Electrical power and communications connectivity with a wide area as well as the local area are available on the utility poles for interconnection to the modular platform.

The cylindrical modular platform can be scaled to meet a variety of data processing, data collection, and user services.

The platform modularity facilitates servicing when it has been deployed in harsh environments. Typically opening electronic assemblies and exposing circuitry to weather elements is not recommended. As could be expected, during harsh weather water and dirt can be introduced into outside electronic assemblies causing shorts and other failures. The cylindrical modular platform provides sealed subassemblies which can be interchanged as needed without exposing internal circuitry.

The pole computer is installed at the same delivery point as other residential utility services. In some cases this may be a utility pole and in others it may be another delivery point such as in a buried container accessible through a manhole cover. In a high rise or business building the modular platform could be installed in the basement area to provide computing services throughout the building for use by the residents. This would also be possible in an apartment building.

Figure 12:
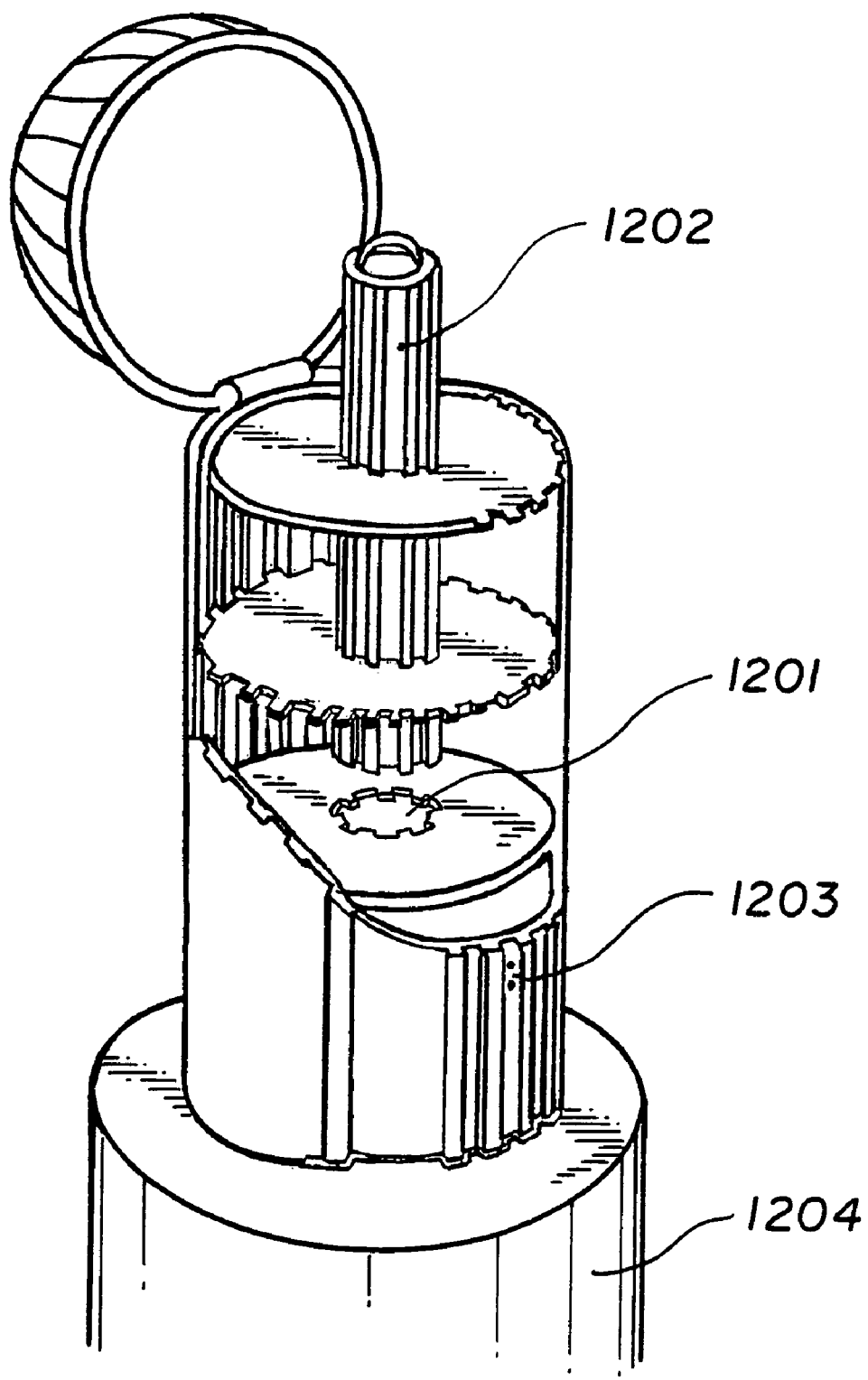
FIG. 12 depicts the internal structure of a modular platform wherein a core processor is shown being inserted in another processor and associated peripheral circuit boards.

The circular circuit boards can also accommodate an internal bus passing through the Applications Expansion Ports (the hole) in the center of the board. The Circuit Support Post may be used to provide auxiliary bus expansion. Circuit tracks along the post make contact with the circumference of the center hole of the circuit board. The center hole 1201, FIG. 12, can also be used to accommodate another cylindrical platform 1202 that comprises electronics that may be considered the Core Processor. This embodiment could support a design of a Personal Computer architecture wherein the center hole system comprises electronics that operate at the high speed Local Bus or PCI bus speed and the boards into which it is inserted, the Peripheral Processor, operate at the IDE bus speeds. This two cylinder embodiment could be inserted into yet another cylinder which may contain all of the connectivity and communication circuits within the building it serves. The outermost container 1204 is accessible to workers to perform services and updates on wiring, power and maintenance. This embodiment can make use of ultra fast computer science technology in the core processor which includes liquid cooling through the core processor center opening in the circular circuit boards. Liquid nitrogen passing through the core processors center post could be used to support super-conducting bus tracks. Grooved channels in the exterior of a platform can be used for signal exchange connectivity with another outer platform enclosure in which it is inserted. The connection may be via use of an electrical conducting strip which is lining a grooved channel or it may be by a transparent window that passes light from the inside light bus through the window to the outside of the enclosure. The windows would be placed in the channel 1203. The outboard platform can make use of the signals as required. The platform may also be placed in a protective enclosure 1204 to protect it from vandalism, tampering and other threats.

When installed, the platform could readily interface with telephone services, metro cable services, and electrical power. In addition the computer could be connected to and provide services to residences in the area. When installed in this location the computer could provide word processing, spread sheet, data base and other residential computing services that would include communications and entertainment enhancements. This concept distributes and provides an intelligent interface for residences. The interface could be utilized when connecting popular distributed systems as well as wide area networks and services. A slave may request services from an associated parent device. The request from a slave may be: (1) a request to the parent device requesting assistance to transport a data signal to a network not available to the slave; (2) a request for the parent device to provide updated software for a slave computer program; (3) a request for the parent device to provide a direct connection between the slave and a remote storage server; (4) a request for the parent device to download any stored information addressed to the slave; (5) a request for the parent device to provide a list of capabilities available from the parent device to which the slave may have access. An access server may be environmentally sealed and accepts transmissions from known and unknown wireless computing platforms that are soliciting services. Solicitations are acknowledged by the access server. The server provides at least one service, such as (1) a connection to high speed Internet resources; (2) an interactive spread sheet application program; (3) an interactive word processing application program; (4) an Interactive Internet browser; (5) a connection to a digital radio source; (6) a connection to a CODEC coder/decoder to interface an analog telephone; (7) activating an alarm monitoring software program; (8) to connect with a video entertainment stream; (9) providing a list of available services; (10) a connection to a cellular telephone network; (11) a connection to a personal communications network; (12) adding a local area network as peer; (13) to download software; and (14) requesting a stronger wireless signal.

Availability of the pole computer will provide an opportunity to place computing capability in homes in which residents are unable to pay the high prices for personal computers. Disadvantaged families could get exposure to automated information and computer services and avoid being set further behind in a rapidly moving technological culture. By locating Pole Computers in disadvantaged neighborhoods we could provide information age exposure, learning, and enhancement of computer literacy. Only the cost of a basic terminal would be necessary in a home, which could be rented for a low subscription cost or purchased over time.

Connection fees will repay the cost of the initial investment over a long period of years, while putting the technology into the homes of many who would not be able to afford the thousands of dollars required today to buy a personal computer system and peripherals. This will help avoid widening a gap between disadvantaged children and others. They will also be able to take advantage of the vast power of the Internet to educate.

In such an embodiment of the modular platform architecture the modular platform would provide a mass storage (disk drive) module, a multi-processing computing module and a residential digital/analog and analog/digital protocol conversion interface module or a CODEC. The Coder/Decoder, CODEC and sub-controllers could convert analog signals to digital signals and vice/versa to provide very high bandwidth connections. Other enhancement modules can be installed as needed.

The External Connection Interface Module 1102 is also the software communications interface module for protocol layers above the physical layer of the OSI protocol stack. It would interface to homes and other residences, and to wide area network services. Within this interface, protocol conversion services are performed. Some conversions would be from analog to digital as well as from digital to analog. Conversion is provided from proprietary protocols to open protocols and ISDN to other protocols.

The conversion software could act as a bridge to provide and simplify network adaptability with the wide range of protocols that exist today, which complicates any prospective program or effort to deliver computing services to homes.

The residential service side of the Platform is connected to the connection interface module with fiber optic cable, twisted pair, coaxial cable or all three media types. The utility service side of this outdoor communications interface will also accommodate any media types as required.

Protocol bridging services are supplied within the software of the Conversion Interface Modules FIG. 1102 ancillary processor. Connection on the utility services side or wide area network is not required to deliver high level functional utility for a residential user of an outdoor modular computer services platform. Many useful computer services are available using personal computer software that can be distributed to residences by an outdoor modular computer services platform.

The outdoor modular computer platform is a weather-tight modular system which is designed to operate in harsh conditions. In some environments the system will require internal cooling, heating and basic climate control to maintain the system within operational tolerances. A Climate Control Module will provide temperature monitoring, operate a heating element, a fan and a pump. The exterior wall of the climate control module can be equipped with a heat exchanger through which the pump can circulate coolant to disperse internally collected heat to the outside surface of the module. To maintain a weather tight sealed platform air or water are circulated within the modules as required. Very hot environments will require climate control modules as part of the platform. If required the platform may be enclosed inside of a climate conditioning shell. Filtered one-way vents may provide internal electronics protection from damage that may occur from the environmental elements passing into the electronics assemblies.

When platform maintenance is required replacement modules can be interchanged by a technician or repair person without exposing interior electronics circuitry to the environment. This makes an outdoor computer platform practical and reliably maintainable in inclement weather conditions. Performance upgrades for platforms can be accomplished in the same way.

As new technology becomes available it can be installed as required to maintain a responsive level of support for the community. Older technology modules that are no longer effective enough for heavy use can be migrated to areas where users are less demanding. As newer and more dense mass storage means and disk storage devices are developed they can be interchanged for old technology. In an area where disk storage is becoming insufficient new technology disk drive modules can be interchanged with the old. Thus the user can be provided service at whatever levels technological progress and advancements provide.

In this way an economy is provided that delivers various levels of technological sophistication to users with various requirements, and thereby we can develop an extended life cycle for computing equipment and reduce the expense of providing services to a wide community. Many small and large businesses have been through the short life-cycle re-investment cycle for personal computers based on the large scale integration micro-computers 80186, 80286, 80386, 80486, etc.

Typically the software, assembly, installation, and understanding of computer technology is daunting to a non-technical person especially when changes are constant.

This invention can provide baseline services that remain constant and do not require a residential user to support and maintain the underlying software, hardware and operating system of the technology. Sophisticated users can network to cutting edge wider area services whenever needed. Delays caused by older telephone connections will be replaced by super speed fiber optic connections between the user and the services computer platform.

Additional resources can be added to a residential computing server system when required. If additional mass storage is required it is possible to add a mass storage disk drive module to operate as a storage server for the computing platforms that operate in the area. The mass storage disk drive module, file server, need not be attached to the same utility pole as a pole computer to provide services to that pole computers users. The storage server can be networked using communications circuits between the resources that comprise a utility pole computing system. Local area network circuits can be dedicated to interconnecting pole computing resources or can be interfaced to use other public utility media that are also on the poles, such as telephone or cable TV media.

One phenomena of micro-computer technology is the short life cycle. Since personal computers have been available many buyers have experienced the rapid obsolescence of their computer systems regularly requiring duplication of the investment several times. A pole computer/server can provide continuous levels of service and thereby allow the home user to avoid the re-investment spiral. Many other advantages of this technology are derived within the software that could be installed to operate at the pole location, and thereby provide advanced services to users.

The cylindrical computer architecture provides an enclosure that is weather resistant, to withstand very harsh conditions. It can be seen that the advantages of the pole computer can be implemented in other embodiments.

The pole computer could also be derived by hanging modules on the pole separately and making electrical connections between them with cables. Placing weather proof modular computer services equipment out in the weather to serve communities is a new solution to relieve a problem of sociological fair access and distribution of technology to everyone. Vice President Al Gore has promoted in many ways the need to connect schools to the Internet. Because of rapid obsolescence the capitol required to connect the schools with current PC based interconnect methods the proposed investments will quickly be lost to Hyper-obsolescence. If the school had a community server on the pole they would not face the problem. If service became slow the Pole Computer processing module can be swapped out and the old one taken away to be made to serve less demanding neighborhoods or developing nations. The standard bus, operating system, and communication interface would remain the same. Ten years after production a server could still be spreading further and further into introductory areas. Today the largest computer services distribution method is provided to the few who are able to buy new systems and scrap the old. A 80386 computer is of little use in today's intense Internet integrated computing activity.

The widespread community value that could be realized using this concept is immediately economically viable and the important contributions that are possible should not be overlooked.

To develop and test the pole computer concept a vertically mounted mother board may be used to prototype circuitry and test new capabilities. Afterwards successfully tested design elements will be incorporated in the prototype cylindrical deployment of the Pole Computer.

The 1996 Telecommunications Act authorizes anyone to enter into the telecommunications market. New entrants will not be welcomed by the Giant Corporations who previously had monopolies. Outlying rural communities are not likely to see Internet connections until long after the urban markets are saturated. The proposed invention will provide a method for including all interested communities.

An incremental approach to evaluating customer interest and feasibility is to deploy a hybrid. A vertical mounted two sided mother-board with connectors on both sides FIG. 13A may alternatively be used within the cylindrical modular platform. The vertical mother-board 1303 (FIG. 13B) will pass through the center axis of the cylinder and will be held within slots within the inner wall of the enclosure to maintain the board in a vertical position.

The vertically mounted two-sided mother-board will provide connectors to accommodate edge connectors from semi-circular boards 1306 (FIG. 13D) mounted perpendicular on both sides of the vertical mother-board.

Conventional rectangular circuit boards may be piggy-backed onto semi-circular carrier boards to integrate test configurations for the modular platform.

The mother-board will provide bus inter-connectivity for the semi-circular boards within the modules. The vertical mother-board will provide a test capability to integrate circuit boards from conventional systems into the cylindrical modular platform without requiring complete re-engineering of the circuits. When the circular boards are integrated with the semi-circular boards and vertical dual sided mother-board a hybrid assembly will be derived to accommodate testing and development.

A connection transition board 1304 will provide inter-connectivity between the two sided mother-board and the other bus structure of the cylindrical modular platform. The transition board is circular in shape with an edge connector at its center 1305 which mates to a vertical two-sided mother-board's vertical top and bottom end edge connectors 1301. The transition board may also inter-connect bus signals from the vertical two-sided mother-board bus to the in-wall bus of the cylindrical modular transport, or the wrap around flexible circuit board.

Various braces and brackets can be used to attach the pole computer to a utility pole. Some old wooden poles require metal bands be attached around the pole with brackets in place for attaching the cylindrical pole computer. If a different embodiment of the pole computer was installed the supporting means would be adapted as required. Other utility pole types will require different methods of attachment.

FIGS. 18, 18A, 18B and 18C illustrate a mounting system that is attached to a utility pole. The pole attachment bracket 1801 provides mounting bars 1802 and a slip-in bracket 1803 comprising an alignment wedge 1804 with a male wedge within the pole side 1804 and female side on the movable bracket 1805 side. Curved swivel arms 1806 are attached to the mounting bars 1802 at the bracket 1801 and on the other end they are attached to a module support ring 1807. Both ends of the arms swivel. The module support ring 1807 will accommodate a module. The lower terminating module is shown 1808 being slipped into the support ring in the direction of the arrow. A combination of the support rings can be used to configure the stack to provide different capabilities. Wire and fiber connect points are not shown in the diagram. Fiber optic connectivity between the platform and the user will provide a truly integrated design and allow the fiber optic to carry signals directly from memory in the platform to memory in the user terminal. Memory to memory over fiber will effectively provide the true bonding to make the network the computer.

Method of Manufacture

An economical method of manufacture is needed in order to produce modular platforms at a low cost. When used within a sensor program the modular platform will be widely deployed to produce data. The platform is also ideal for remote control. A Universal Controller can be derived to both collect and control. The modules need to be produced at a low enough cost that they can be considered disposable.

When a modular platform is deployed as a pole computer it also needs to be restrained in order to deliver computer services to consumers. If manufacturing costs are controlled, subscription costs can be minimized and deployment can be wider and occur sooner.

The circular circuit boards used within the modular platform lend to a method of manufacture, shown in FIG. 14, that is highly automated. The circular circuit boards are held on a shaft 1401 (FIG. 14A) that passes through the center opening in each board 1402 (FIG. 14B). End fittings that are provided with an assembly hole 412 (FIG. 4) may also be included in this process. When all of the circuit boards and end fittings are placed on the shaft, which may be on the end of a robotic arm, the arm will present the assembly of circuit boards in a rolling machine.

As shown in FIG. 14, the rolling machine is fitted with heated rollers 1403. The machine will wrap a flexible circuit board around the circular circuit board assembly that is mounted on the shaft of a robotic arm or similar shaft whether it is mounted vertically or horizontally.

A pre-heater 1404 heats the flexible circuit board as the flexible circuit board is moved toward the heated wrapping rollers. A tooth 1405 (FIG. 14C) on the circular board engages the flexible board as it is fed into the rotating assembly and the tooth pulls the circuit board around the circular boards wherein the contacts on rigid board penetrate the openings 1406 of the flexible circuit board as the wrapping occurs. At the bottom of the rolling machine a container of molten solder is maintained at a level that will submerse the contact points of the circular circuit board where it penetrates the preheated flexible circuit board.

When the flexible circuitry wraps around the circular circuit board assembly the molten solder joins the contacts together. The circuitry on the boards are soldered together in this process. By controlling the temperature of a pre-heating plate FIG. 1404 and the heated rollers quality control for the solder joints can be optimized.

After an assembly is soldered in this way the rollers will open sufficiently to allow the robot arm to remove the soldered assembly and insert it into the enclosure 1407 and thereafter the arm will select new boards and end-fittings from the holders 1407 and retrieve another assembly to be joined.

Figure 14D:
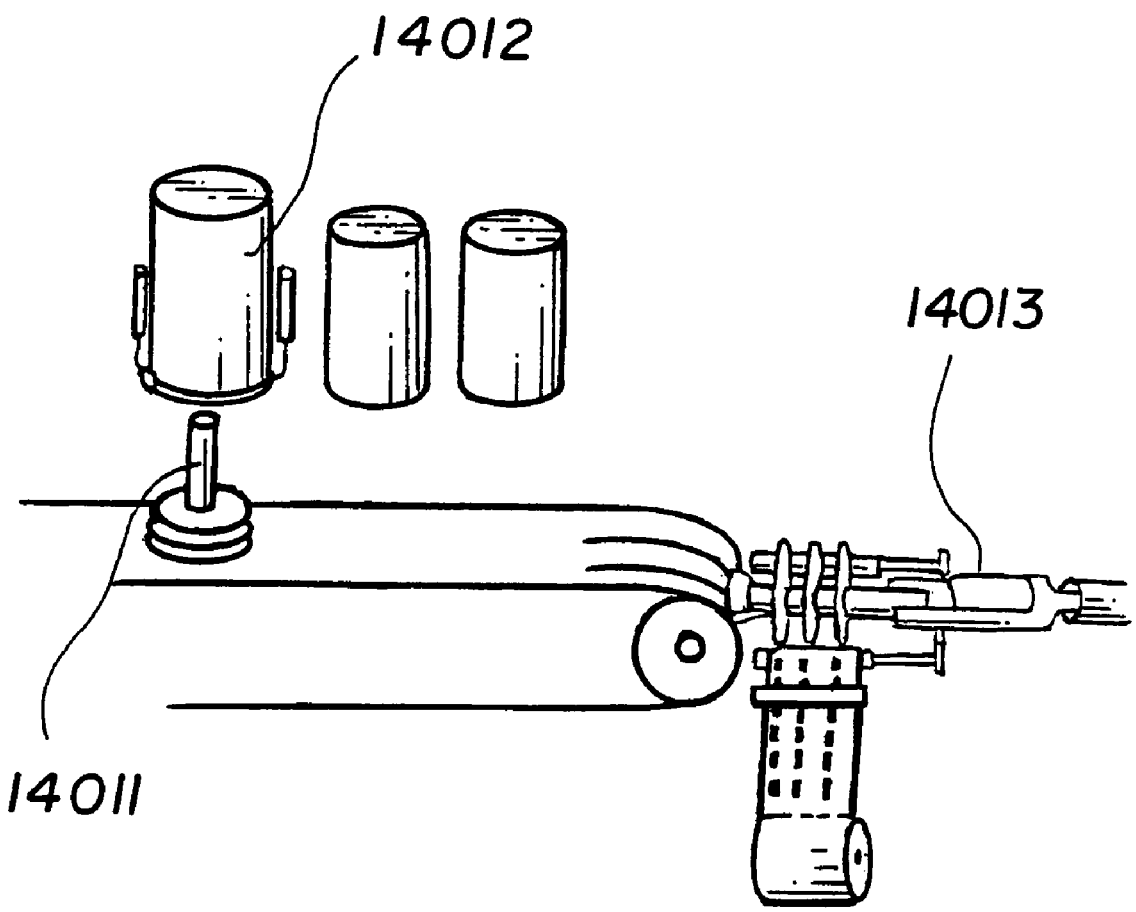
FIG. 14D depicts a partial view of the method according to the present invention showing a vertical processing embodiment.

A vertical assembly method could also be utilized wherein a post passes beneath containers holding the boards 1401 (FIG. 14A). As shown in FIG. 14D, the post 14011 is under a board holder 14012 the board will be moved onto the post and the eventual result will be a stack of boards that comprise a platform. An advantage to vertical processing is simplification. A transition from the vehicle plane to the horizontal will bring the boards into the rollers and wrapping assembly. This transition could be made where the conveyor belt reaches its end. The post will begin to turn toward the horizontal plane. At the correct position the rollers close and the belt will stop. At this point another grip 14013 will be taken on the post at its top. This grip will provide the rotation to provide the same actions as the robot arm. A magnetic base affixed to the belt will allow control of the post to pass to another controller of the motion.

Of course the assembly can be done by hand by mimicking the automated process.

Using pick and place machines to make the circuit boards and the rolling flexible circuit board joining process to create the assemblies the modules can be produced by machines. This process can be extended to manufacture other electronics products also.

Figures 17, 17A:
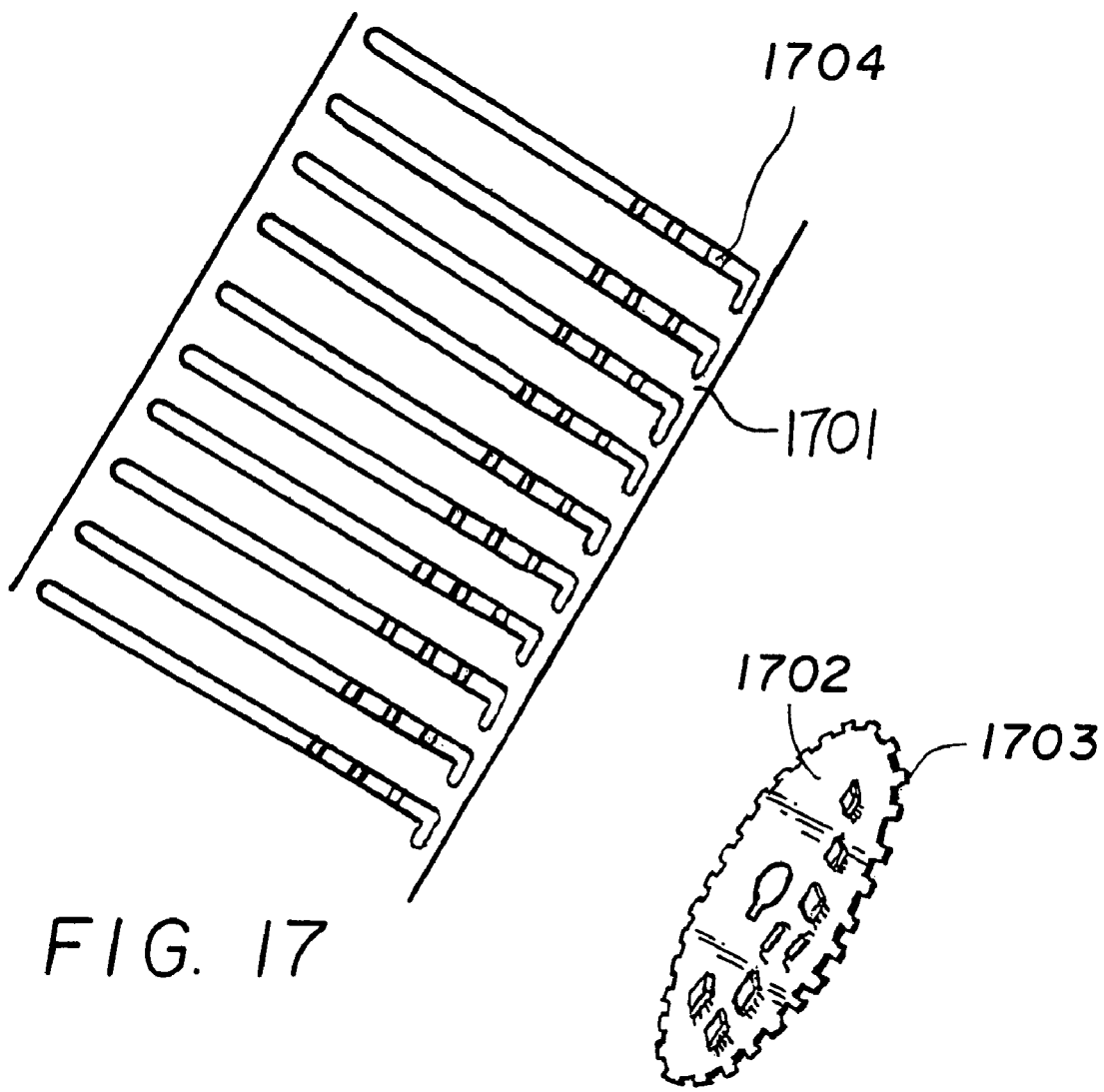
FIGS. 17 and 17A depict a flexible motherboard laid out flat showing bus tracks and holes in the bus tracks to accommodate protrusions from the circuit boards to which they will be electrically interconnected during soldering.

These circular circuit boards FIG. 17, 1702 have, on the perimeter, protruding contacts 1703. These contacts are designed to fit into openings 1704 on the flexible circuit board 1701. This results in a board that looks much like a gear. During production the circular circuit boards mesh with openings in the flexible circuit board. A stack of circular circuit boards comprising protruding contacts on the perimeter may be wrapped with a flexible circuit board comprising precise openings that are aligned to provide a point where the protruding contacts pass through the openings, thereby making electrical contact between the circular circuit boards protruding contacts and electrical contacts on the flexible circuit board and providing electrical connectivity among the stack of circular circuit boards. The flexible circuit boards comprise mounted electronic components. A stack of hex-shaped circuit boards comprising contacts protruding from the perimeter of the boards may be wrapped with a combination of flexible joints and rigid circuit boards. A wrapper may be provided for the hex shaped circuit board, wherein the wrapper may rest on a flat part of the hex boards and the flex joints are comprised to allow the rigid portion of the wrapper to fold around a corner of the hex board. Contacts protruding from the hex boards may penetrate openings in the wrapper and join circuitry from the rigid boards on the wrapper with the hex shaped wrapper.

In order to separate a single flex circuit board from the roll or supply a flexible circuit board wraps around the assembly, as the feed rollers stop feeding the flexible circuit board the assembly rollers continue rolling. This creates a separation force between the wrapped assembly and the flex circuit on the feed. The individual flex boards are separate at a perforation line on the supply roll of flexible circuitry. The tension on the flexible circuit boards' perforation will cause the flex board to tear and separate as it wraps around in the roller assembly. A cutter may also be added to eliminate adjustment issues.

Figure 15:
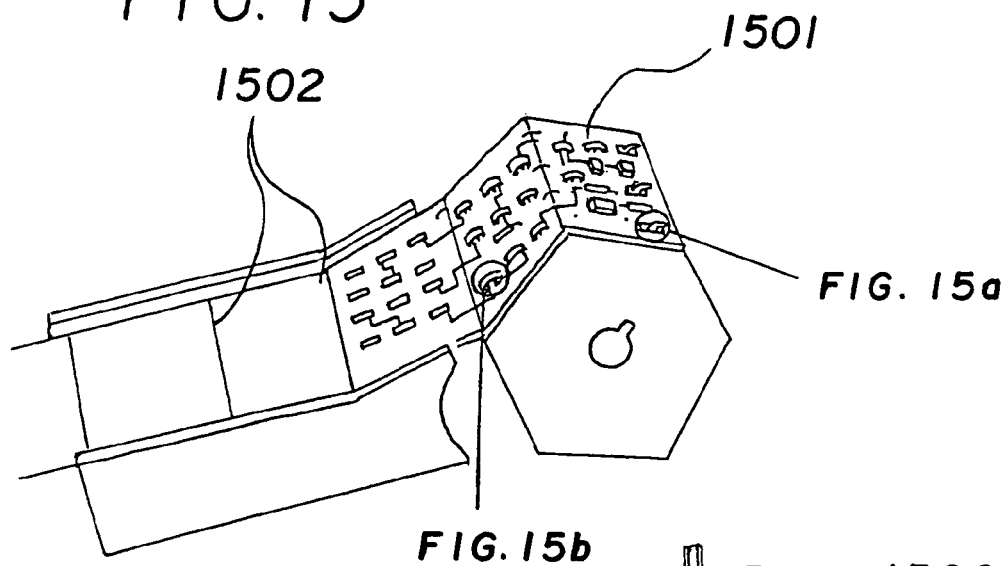
FIG. 15 depicts another method of manufacture that integrates rigid circuit boards interconnected by flexible circuitry. The hex shape internal circuit boards are also carried by a hole in the center of the hex boards.
Figure 15B:
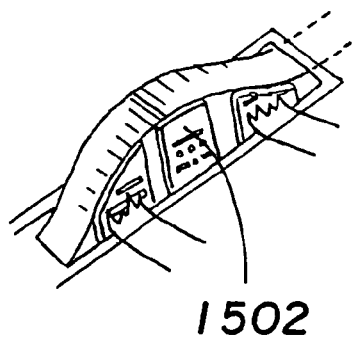
FIGS. 15A and 15B depict partial views of a method of manufacture according to the present invention showing protruding contacts on circular circuit boards.
Figure 15A:
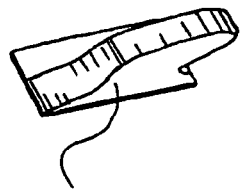

The pick up point where the flexible circuit board engages the circuit board to start the wrap may be a fine adjustment due to the teeth on the board catching at the holes in the flex board. The protruding contacts on the circular boards 1502 (FIG. 15B), 1503 (FIG. 15A) can be made as shown in FIG. 15.

The rounded contact will not engage the holes in the flex board but when a single tooth brushes the hole the flex board will be engaged. This can be used for all the boards. It is not particular to the rigid board hybrid.

Figure 24:
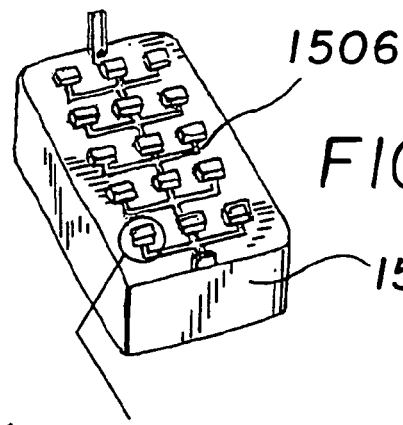
FIG. 24 depicts a method according to the present invention for soldering a rigid circuit board.

The rigid board hybrid soldering operation is different than that for the circular boards. The rigid board will be stopped when it is horizontal at the lowest point on the assembly. Item 1505 (FIG. 24) is a square pot of solder. Within this larger solder pot, and under the surface of molten solder is a matrix.

Figure 24A:
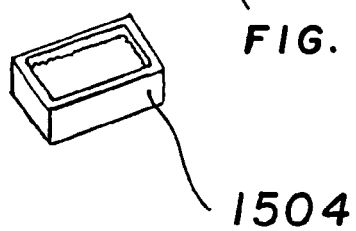
FIG. 24A depicts a partial view of a method according to the present invention showing solder pots in a rigid circuit board.

The matrix 1506 (FIG. 24) is comprised of many carefully arranged solder pots 1504 (FIG. 24A). When the board is stopped the matrix is raised up out of the molten solder and pushes the small vessel 1504 (FIG. 24A) up onto the connection points and applies solder to the contacts to join them together.

One method to join the flex circuit to the round boards can be accomplished by developing circular boards with square notches between the protruding contact points around the perimeter of the board. The notches will act as teeth that penetrate the flexible circuit and the solder points come into contact. The circular circuit board acts as a gear that can pull the flex circuit onto the assembly. The flex circuits can be provided on rolls or strips. The circuit board is equipped with a hook 1405 (FIG. 14C) which is designed to start the engagement of the flexible circuit board during rotation and begin the pulling of the circuit board around the circular circuit boards.

Hexagonal circuit boards may also be processed FIG. 15 with the added feature of having rigid circuit boards FIG. 1501 with flexibility at hinge points where the board meets the corners of the hex shape. This would render a hexagonal cylinder with rigid circuit boards between the hinge points. This system allows existing rigid board designs that are completed to be adapted to this manufacturing method.

Architecture

It should be seen from the illustrations and commentary that the architecture of circular circuit boards and a sealed enclosure can provide valued capabilities in our current technological stance in an economy entering into truly global competition. There may still be an opportunity to establish a better technology while the U.S. still has some advantage amidst the tough competition. Some of the lost electronics manufacturing capabilities could possibly be reclaimed.

Tubular electronic assemblies offer many advantages to ameliorate the losses resulting from the hyper-obsolescence occurring in electronics technology. Many of us have invested several thousand dollars to purchase a Personal Computer and found it to be obsolete in only a few years, which led to the purchase of another and another. This economic problem could be overcome by using the packaging suggested herein.

If the front of a PC cabinet 1601 (FIG. 16) were equipped with a hole 1602 into which a cylinder assembly 1603 (FIG. 16A) would fit we have a form factor for an improved system. All of the electronics for a PC can be created on circular circuit boards. When they are enclosed within the cylindrical enclosure which bears an end-fitting 1604 (FIG. 16A) that will mate with a connector 1605 (FIG. 16) inside the cabinet the improved form is complete. Upgrading to a more powerful system would be accomplished by removing the tube and replacing it with another. Since the removed tube is still a complete system it can be placed back in the market easily. Tubes are secured by threaded bar 1607 (FIG. 16C) and nut 1606 (FIG. 16D).

Updated capabilities can be easily added by removing cylindrical modules and replacing them with newer technology that interfaces in the same way.

The proposed modularity offers many advantages as explained above. To adopt a standard implementation renders special benefits of interchangeable modules for maintenance, up-grade and services it is within this sort of economy of scale that the real advantages of a long life cycle begin to be realized.

An example spin off application of outdoor mounted computing platforms is providing addressable real time video sources for consumers. If a video camera is mounted in a lower terminating module of the cylindrical platform (pole computer) and the enclosure is transparent the platform will provide video information on demand to a remote user. Such a module comprising a transparent enclosure and a remote control video camera with internal circuit switching could provide stored, time shared, or real time video displays for network connected users. Access to video cameras installed in surveillance areas, or just areas of occasional interest to service users, could view traffic conditions, weather conditions, security interests, airline monitors at airports, video snapshots, high crime areas, automated recording triggered by gun shots, scenic view areas, crowd conditions at attractions, etc. When a modular platform is configured as a digital video camera like the one used in the flashlight camera 1606 (FIG. 16B) it can be mounted in many interesting view points. The versatile mounting methods will facilitate this. These devices would respond to Internet contact over the communications link within the platform.

Figure 21:
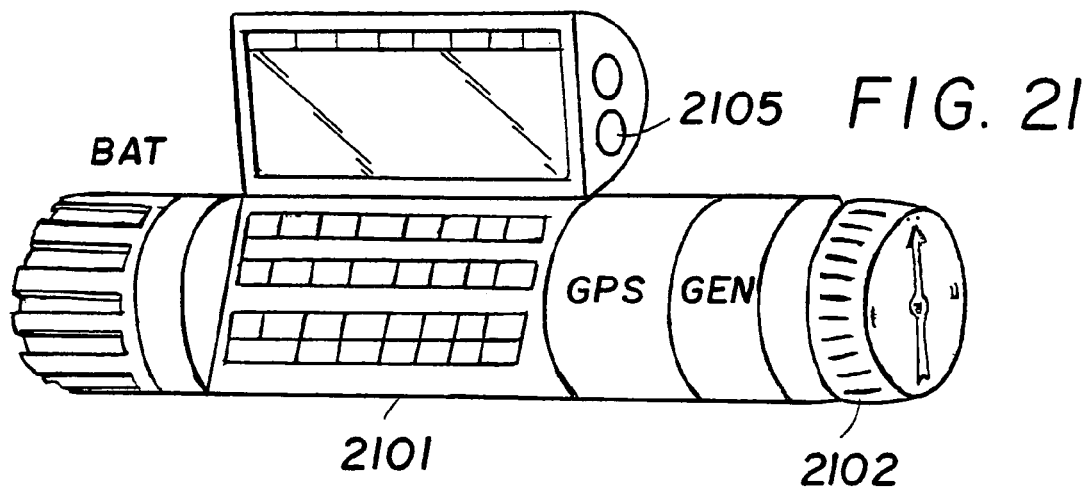
FIGS. 21, 21A, 21B, 21C, 21D and 21E illustrate a pilots computer and communications support platform for pilot down situations. It is equipped with a crank knob to wind a heavy spring which will drive gears to turn a small power generator. It also comprises a GPS module and a terminal module. The terminal module requires a screen command device to interface which is also shown with some detail of its internal workings.
Figure 21A:
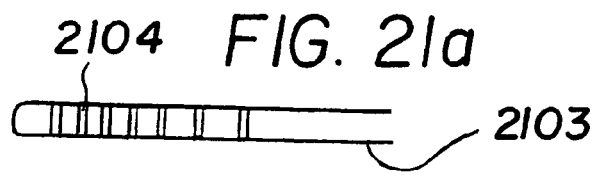
Figure 21B:
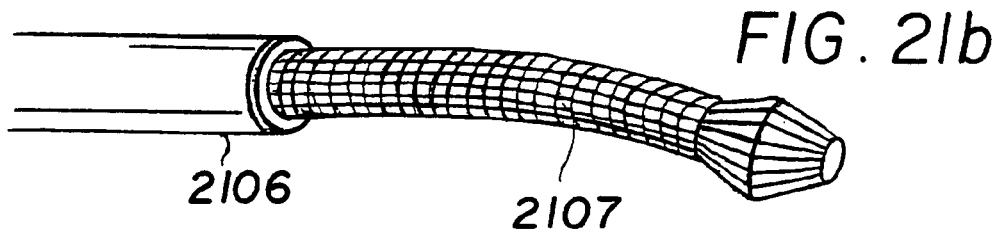
Figure 21C:
Figure 21D:
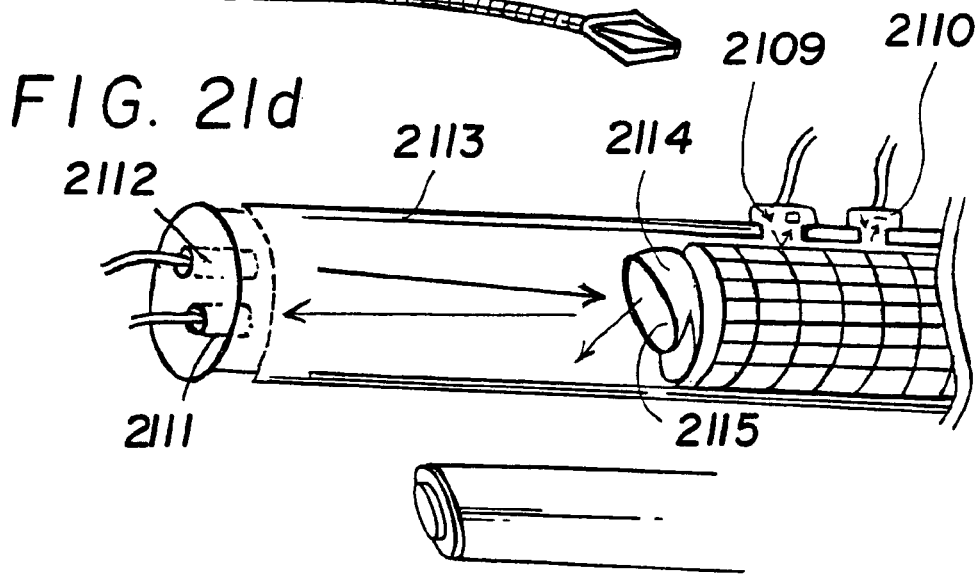
Figure 21E:
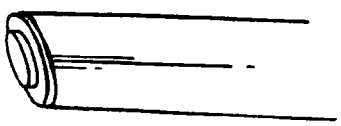

One module that can be included in an assembly is a user interface module. FIG. 21 shows this module 2101. It is oriented to a "pilot down" mission. A module is included in this stack that provides a compass knob 2102 which may be used to wind a strong spring. The knob, spring and generator may be considered one module. The spring will drive a gear assembly connected to a small motor generator. A person can twist the knob a number of times with substantial torque and the wound spring can drive a gear assembly which will turn the strong force into high rpm for the small generator. This will enable the device to be recharged when needed. Additionally this stack includes a GPS module and a rechargeable battery module. The user interface module is equipped with an LCD screen a micro keyboard and a screen command device. The screen command device will reduce the difficulty of working with a tiny keyboard when in a hostile environment, including weather and dirt.

The screen command device may have inserted into it a memory stick 2103 which contains maps and mission related information. When the memory 2104 is installed in opening 2105 the information may be added to customize the device for a mission.

The screen command device 2106 is a tube which has a flexible inner tube 2108. The interior tube is flexible and it has dark lines which are equally spaced and parallel on its surface both along the length and around the tube. The lines 2107 are a gradient which can be used to register movement of the interior tube either in and out of the exterior tube or around as when it is twisted or spun. The movement is detected by the sensors 2109 and 2102 which shine light on the surface and monitor the reflected light. The reflection is minimized when a dark line passes beneath the photo diode. The resulting signal changes may be delivered to other circuitry within the device for registering the position change. Another light source 2111 and photo detector 2112 are used within the exterior tube 2113. They are placed at the end of the tube opposite the end in which the inner tube moves. The inner tube is air tight. The end of the inner tube has affixed to it a small mirror 2115. The mirror is mounted on a flexible holder 2114. The holder points the mirror down and it will reflect any light onto the side-wall of the exterior tube. The holder is movable and the shape of it is expandable when internal pressure of the interior tube is increased. When the pressure increases the holder flexes and the mirror moves toward a vertical position and in the process the light shining on it is reflected down to the end of the tube and is detected by the photo detector and this registers as a command when communicated to the appropriate circuit to process the commands.

Figure 22C:
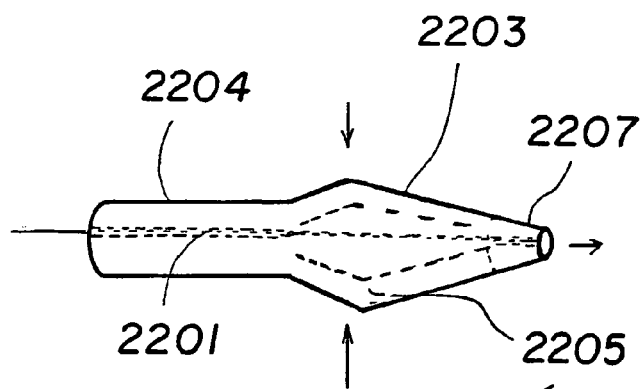
FIGS. 22, 22A, 22B, 22C and 22D illustrate an innovation in the screen command device that detects finger pressure from its user and transfers the pressure to a small mirror inside the module and causes light to be reflected onto a photo diode which executes the desired command.
Figure 22D:
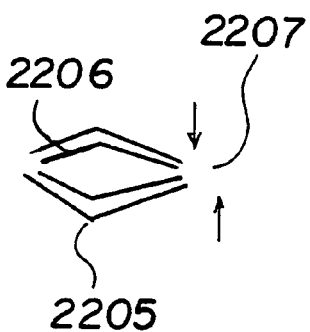
Figure 22B:
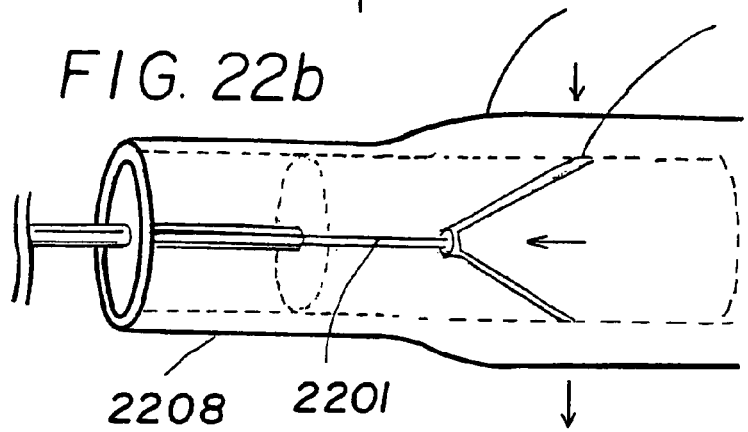
Figure 22A:
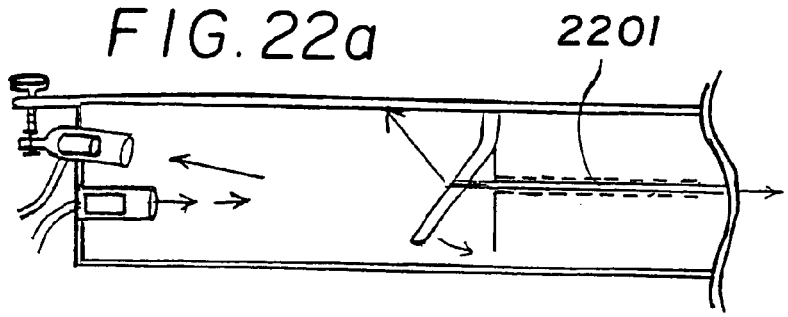
Figure 22:
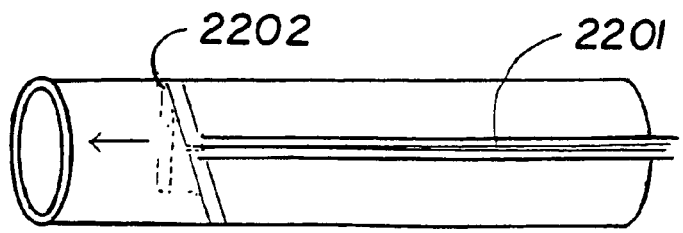
Figure 23:
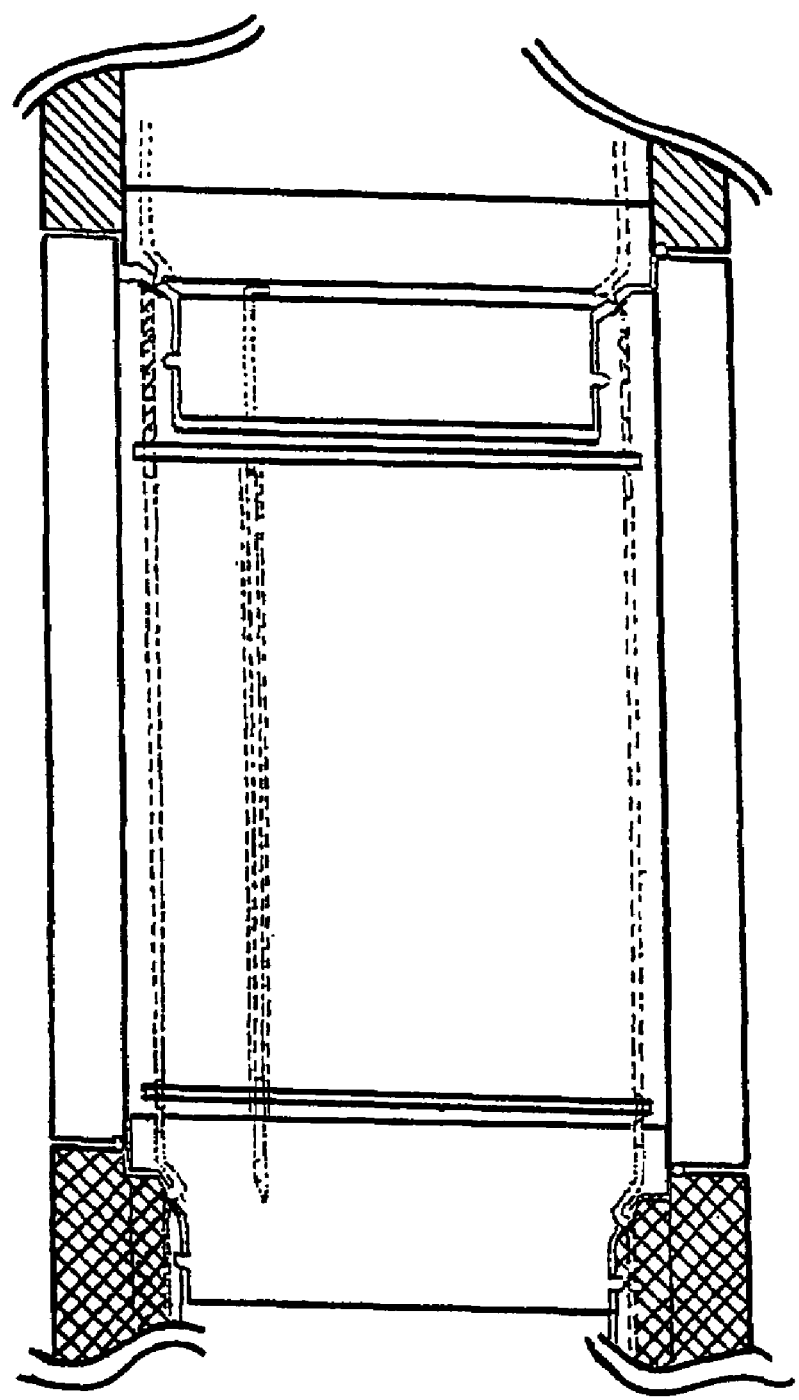
FIG. 23 depicts a partial view of an embodiment of the modular sensor platform.

The flexure of the mirror in FIG. 22 can be accomplished by using a small metal bar 2201 passing through an opening that runs down the interior of the movable tube. One end of the metal bar is attached to the mirror and the mirror is, when at rest, held in a no-signal position. The mirror, or holder, is hinged on one end 2202 and is held at its rest position when no force is applied. The small bar can be moved to push the mirror or pull the mirror through a 'signal on' condition. The end of the bar that the user holds can be configured to either push or pull. The handle 2203 is made of a flexible material like rubber. Depending on the shape of the interior of the handle the bar can be made to move in either direction. One handle 2204 shows two arrows in a counter position indicating a squeeze of the hollow rubber handle. When the squeeze is applied the wide diameter 2205 will be forced into a smaller diameter 2206. Lowering the apex in the handle geometry forces the triangle sides into a straight line and the handle end being flexible is forced away, and since the bar is attached to the handle's tip, the action is transferred to the mirror. The handle 2208 is configured to create a pushing action on the bar toward the mirror.

The mirror can be moved in various ways in response to the bar's movement. The mirror can be moved by pneumatic pressure or mechanical pressure. The thickness of the rubber in the handle can be varied to aid in control of the movement.

Given the large number of uses of the Modular Platform versatile mounting features will be needed. To provide some of the versatility the outside of the module may be equipped with a section of threads on its surface. FIGS. 19, and 19A to 19E illustrate a couple of uses of the exterior mounting threads. Many more are possible.

What is claimed is:

1. A hand held modular sensing and computing platform comprising a computer, a keyboard, a display screen, a curser control device for selecting screen icons, a battery, a radio transmitter, a radio receiver, an interchangeable memory module connector for attaching added storage memory inserts, an added storage memory insert inserted in the interchangeable memory module, and a GPS receiver, contained within a hand held modular platform.

2. A hand held modular sensing and computing platform as claimed in claim 1 comprising a cylindrical enclosure.

3. A hand held modular sensing and computing platform as claimed in claim 1 comprising an elliptical enclosure.

4. A hand held modular sensing and computing platform as claimed in claim 1 further comprising a compass.

5. A hand held modular sensing and computing platform as claimed in claim 1 wherein modularity is extended to modules within a single enclosure module, said modularity comprising application specific integrated circuits and/or modular application circuit boards.

6. A hand held modular sensing and computing platform as claimed in claim 1 comprising enclosure openings to accommodate insertion of interchangeable mass storage memory inserts wherein said memory inserts contain mapping and navigation data and user support information.

7. A hand held modular sensing and computing platform comprising a computer, a keyboard, a display screen, a curser control device for selecting screen icons, a battery, a radio transmitter, a radio receiver, an interchangeable memory module connector for attaching added storage memory inserts, a GPS receiver, and a power generator module wherein user twisting of a grip moves said generator module to generate electrical power for operating said platform.

8. A hand held modular sensing and computing platform as claimed in claim 1 further comprising a communications encryption module for protecting data during operation.

9. A hand held modular sensing and computing platform comprising a computer, a keyboard, a display screen, a curser control device for selecting screen icons, a battery, a radio transmitter, a radio receiver, an interchangeable memory module connector for attaching added storage memory inserts, a GPS receiver, and a command and control software module configured to provide an interactive user interface with said platform, wherein said platform provides communications with remote radio equipped sensors and a platform operator can command and control said sensors from a remote location.

10. A handheld modular computer and communications platform comprising parent communications servers wherein said parent communications servers are first hop radio interface nodes serving a handheld modular computer, said nodes being connected to local and/or wide area networks and said servers relaying communications packets addressed to and from said platform, said platform comprising an end fitting for attaching accessory modules connecting said attachments to a platform computer bus, said platform also comprising a power supply and a control protocol for communicating with platform computer accessory modules.

11. A handheld modular computer and communications platform as claimed in claim 10 wherein said platform comprises a connector for accepting accessory modules that add functions to said platform, wherein platform system software recognizes an accessory module unique identifier within said accessory module, and said recognition software configures platform operational software to integrate said added accessory module function into a platform operational system.

12. A handheld modular computer and communications platform as claimed in claim 11 wherein said platform electrically downloads software from a remote network node, and said platform software receives, recognizes and integrates said downloaded software into said platform software operating system.

13. A handheld computing and communications platform comprising a digital camera, a flashlight, a digital memory, a Radio Frequency transceiver, a communications controller, a button, a switch, and a battery functioning together to provide a digital camera configured to store a picture in said memory when said button is depressed, and which transports said picture stored in said memory to a remote receiver by activating said transmitter.

14. A handheld computing and communications platform as claimed in claim 13 comprising additional light bulbs for brighter illumination of a subject.

15. A handheld computing and communications platform as claimed in claim 13 further comprising an LCD that can provide information to a user operating said platform.

16. A handheld computing and communications platform as claimed in claim 13 further comprising an interchangeable memory module for attaching expanded storage memory.

17. A handheld computing and communications platform as claimed in claim 13 which records audio information for radio transport.

18. A handheld computing and communications platform as claimed in claim 13 further comprising a reflector to project light toward the direction that said camera is directed.

19. A handheld computing and communications platform as claimed in claim 13 additionally comprising a lens over a camera lens, the lens being enclosed in a retainer mounted upon threads whereby twisting said retainer will adjust a focal distance of said lens and camera.

20. A handheld computing and communications platform as claimed in claim 13 wherein said platform is vertically mounted in a water resistant transparent enclosure.

21. A handheld computing and communications platform as claimed in claim 13 wherein said platform comprises a connector for accepting accessory modules that add functions to said platform, wherein platform system software recognizes an accessory module unique identifier within said accessory module when said accessory is attached, and said recognition software configures platform operational software to integrate said added accessory module into a platform operational system.

22. A handheld computing and communications platform as claimed in claim 21 wherein said accessory module is for chemical detection.

23. A method of customizing a handheld computing and communication platform comprising attaching an end fitting to a handheld computing and communication platform, said end fitting providing electrical and mechanical connection means, said connection means serving to facilitate incorporation of accessory modules, said modules comprising sensors and detection transducers that extend the operational functionality of the platform to include embedded computing systems within a module, said embedded systems independently operating to provide a platform function, wherein a module communicates with any other module also connected to said platform and modules installed on said platform make requests or provide service to any other module installed on said platform, said modules further comprising identification means to represent said module identity to be detected by said platform operating software so that said platform can incorporate any said module into platform operations, and accessory module functionality extends to sensors and detection transducers, radio modules, disk memory, ancillary processors, digital signal processors, cameras, audio transport, power supplies, actuators, GPS, generators, fuel cells, gas detectors, or computer controlled accessories, said platform also comprising an operator interface wherein said operator may use a platform keyboard with display interface or a radio interface for said operator to gain platform access and provide control from a wireless network node.

* * * * *